(12) United States Patent
Kai et al.

(10) Patent No.: US 7,704,832 B2
(45) Date of Patent: Apr. 27, 2010

(54) INTEGRATED NON-VOLATILE MEMORY AND PERIPHERAL CIRCUITRY FABRICATION

(75) Inventors: James Kai, Santa Clara, CA (US); Tuan Pham, San Jose, CA (US); Masaaki Higashitani, Cupertino, CA (US); George Matamis, San Jose, CA (US); Takashi Orimoto, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 47 days.

(21) Appl. No.: 12/058,512

(22) Filed: Mar. 28, 2008

(65) Prior Publication Data

US 2008/0248621 A1 Oct. 9, 2008

Related U.S. Application Data

(60) Provisional application No. 60/909,713, filed on Apr. 2, 2007.

(51) Int. Cl.
*H01L 21/8247* (2006.01)
(52) U.S. Cl. .................... 438/258; 257/E21.179
(58) Field of Classification Search ......... 438/257–267; 257/E21.179
See application file for complete search history.

(56) References Cited

U.S. PATENT DOCUMENTS

| | | | |
|---|---|---|---|
| 5,104,819 A * | 4/1992 | Freiberger et al. .......... | 438/593 |
| 5,459,091 A | 10/1995 | Hwang | |
| 5,668,034 A | 9/1997 | Sery et al. | |
| 5,856,221 A * | 1/1999 | Clementi et al. ............ | 438/258 |
| 5,861,347 A | 1/1999 | Maiti et al. | |
| 6,040,220 A | 3/2000 | Gardner et al. | |
| 6,066,534 A | 5/2000 | Son | |
| 6,204,159 B1 | 3/2001 | Chang et al. | |
| 6,746,920 B1 | 6/2004 | Wen et al. | |
| 6,808,988 B1 * | 10/2004 | Chen et al. .................. | 438/263 |
| 6,888,755 B2 | 5/2005 | Harari | |

(Continued)

OTHER PUBLICATIONS

Chan, et al., "A True Single Transistor Oxide-Nitride-Oxide EEPROM Device," IEEE Electron Device Letters, vol. EDL-8, No. 3, Mar. 1987, pp. 93-95.

(Continued)

*Primary Examiner*—Richard A. Booth
(74) *Attorney, Agent, or Firm*—Vierra Magen Marcus & DeNiro LLP

(57) ABSTRACT

Non-volatile memory and integrated memory and peripheral circuitry fabrication processes are provided. Sets of charge storage regions, such as NAND strings including multiple non-volatile storage elements, are formed over a semiconductor substrate using a layer of charge storage material such as a first layer of polysilicon. An intermediate dielectric layer is provided over the charge storage regions. A layer of conductive material such as a second layer of polysilicon is deposited over the substrate and etched to form the control gates for the charge storage regions and the gate regions of the select transistors for the sets of storage elements. The first layer of polysilicon is removed from a portion of the substrate, facilitating fabrication of the select transistor gate regions from only the second layer of polysilicon. Peripheral circuitry formation is also incorporated into the fabrication process to form the gate regions for devices such as high voltage and logic transistors. The gate regions of these devices can be formed from the layer forming the control gates of the memory array.

21 Claims, 15 Drawing Sheets

U.S. PATENT DOCUMENTS

| | | |
|---|---|---|
| 7,026,684 B2 | 4/2006 | Sakuma et al. |
| 2002/0146883 A1 | 10/2002 | Furuhata |
| 2005/0207225 A1 | 9/2005 | Chen et al. |
| 2006/0286749 A1 | 12/2006 | Tseng et al. |
| 2007/0128787 A1 | 6/2007 | Higashitani |
| 2007/0243680 A1 | 10/2007 | Harari et al. |
| 2008/0128781 A1* | 6/2008 | Violette ............ 257/316 |

OTHER PUBLICATIONS

Nozaki, et al., "A 1-MbEEPROM with MONOS Memory Cell for Semiconductor Disk Application," Journal of Solid State Circuits, vol. 26, No. 4, Apr. 1991 IEEE, pp. 497-501.

Choi, Yang-Kyu, et al., "Sublithographic nanofabrication technology for nanocatalysts and DNA chips," J.Vac Sci. Technol. B 21(6), American Vacuum Society, Nov./Dec. 2003, pp. 2951-2955.

U.S. Appl. No. 11/623,314, filed on Jan. 15, 2007.
U.S. Appl. No. 11/623,315, filed on Jan. 15, 2007.
U.S. Appl. No. 11/725,866, filed on Jun. 20, 2007.
U.S. Appl. No. 12/014,689, filed on Jan. 15, 2008.
U.S. Appl. No. 12/061,642, filed on Apr. 2, 2008.
U.S. Appl. No. 12/061,641, filed on Apr. 2, 2008.

Invitation To Pay Additional Fees, Patent Cooperation Treaty, PCT Application No. PCT/US2008/059035 filed on Apr. 1, 2008, Jul. 16, 2008.

International Search Report & The Written Opinion of the International Searching Authority, Patent Cooperation Treaty, Application No. PCT/US2008/059035 filed on Apr. 1, 2008, Oct. 1, 2008.

* cited by examiner (y-direction)

(x-direction)

(x-direction)

(y-direction)

(y-direction)

(y-direction)

(y-direction)

(y-direction)

(y-direction)

(y-direction)

(y-direction)

(y-direction)

(y-direction)

(y-direction)

(y-direction)

(y-direction)

(y-direction)

(y-direction)

(y-direction)

INTEGRATED NON-VOLATILE MEMORY AND PERIPHERAL CIRCUITRY FABRICATION

PRIORITY CLAIM

The present application claims priority from U.S. Provisional Patent Application No. 60/909,713, entitled "NONVOLATILE MEMORY FABRICATION," by Kai et al., filed Apr. 2, 2007, incorporated by reference herein in its entirety.

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes. U.S. Pat. No. 6,888,755, entitled "Flash Memory Cell Arrays Having Dual Control Gates Per Memory Cell Charge Storage Element," by Eliyahou Harari, incorporated herein by reference, describes a memory array with a dual control gate structure. U.S. Pat. No. 7,026,684, entitled "Nonvolatile Semiconductor Memory Device," by Sakuma, et al., incorporated herein by reference, describes a memory with an inverted-T type floating gate structure. The charge storage element is divided into two regions having different dimensions.

Fabricating the components of the such memory devices at the specified feature sizes poses numerous demands on the fabrication processes. Moreover, the fabrication of peripheral circuitry for the memory array, including such devices as high voltage transistors etc., is complicated by the reduced feature sizes used for the memory array and the types of fabrication employed for the array, such as spacer-assisted patterning techniques.

SUMMARY OF THE INVENTION

High density semiconductor devices and methods of fabricating the same are provided in accordance with one or embodiments.

Non-volatile memory and integrated memory and peripheral circuitry fabrication processes are provided. Sets of charge storage regions, such as NAND strings including multiple non-volatile storage elements, are formed over a semiconductor substrate using a layer of charge storage material such as a first layer of polysilicon. An intermediate dielectric layer is provided over the charge storage regions. A layer of conductive material such as a second layer of polysilicon is deposited over the substrate and etched to form the control gates for the charge storage regions and the gate regions of the select transistors for the sets of storage elements. The first layer of polysilicon is removed from a portion of the substrate, facilitating fabrication of the select transistor gate regions from only the second layer of polysilicon. Peripheral circuitry formation is also incorporated into the fabrication process to form the gate regions for devices such as high voltage and logic transistors. The gate regions of these devices can be formed from the layer forming the control gates of the memory array.

Peripheral circuitry formation is also incorporated into the fabrication process to form the gate regions for devices such as high voltage transistors. In one embodiment, non-volatile semiconductor memory having dual control gate cell structures is formed. The second layer of polysilicon can be etched to occupy the spaces between adjacent charge storage regions adjacent in the column direction. The adjacent charge storage regions will share a common control gate formed therebetween.

A method of fabricating non-volatile memory in accordance with one embodiment includes forming a first layer of dielectric material over a surface of a substrate, forming a layer of charge storage material over the surface of the substrate, and etching the layer of charge storage material to form a set of charge storage regions over the first layer of dielectric material at a first portion of the substrate. The charge storage regions include sidewalls elongated in a first direction with spaces between opposing sidewalls of storage regions adjacent in a second direction substantially perpendicular to the first direction. Fabrication further includes removing the layer of charge storage material from a second portion of the substrate, forming a second layer of dielectric material over the surface of the substrate, forming a layer of gate material over the surface of the substrate, etching the layer of gate material at the first portion of the substrate to form a set of control gates for the set of charge storage regions, and etching the layer of gate material at the second portion of the substrate to form a gate region of a select transistor for the set of charge storage regions.

In another embodiment, a method of making non-volatile memory includes fabricating at least a portion of the peripheral circuitry using one or more of the memory array process steps. Such methods can include forming a first dielectric region elongated in a first direction at a first portion of a substrate, forming a first layer of dielectric material over a surface of the substrate with the first layer overlying the first dielectric region at the first portion of the substrate, forming a set of charge storage regions over the first layer of dielectric material at a second portion of the substrate such that the charge storage regions having substantially vertical sidewalls elongated in the first direction and separated with spaces therebetween in a second direction substantially perpendicular to the first direction, forming a second layer of dielectric material at the first portion and the second portion of the substrate, removing the second layer of dielectric material at the first portion of the substrate, forming from a first layer of conductive material a set of control gates for the set of charge storage regions, and forming from the first layer of conductive material a gate region of a peripheral gate transistor, the peripheral gate transistor including a gate dielectric region formed of the first dielectric region and the first layer of dielectric material.

Other features, aspects, and objects of the disclosed technology can be obtained from a review of the specification, the figures, and the claims.

DETAILED DESCRIPTION

Figure 1:
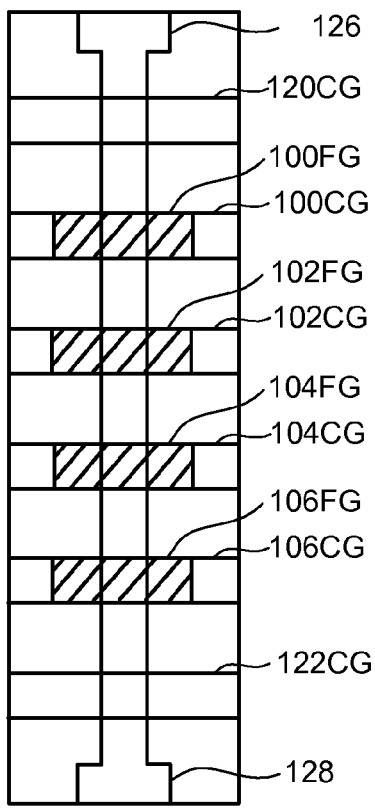
FIG. 1 is a top view of a NAND string.
Figure 2:
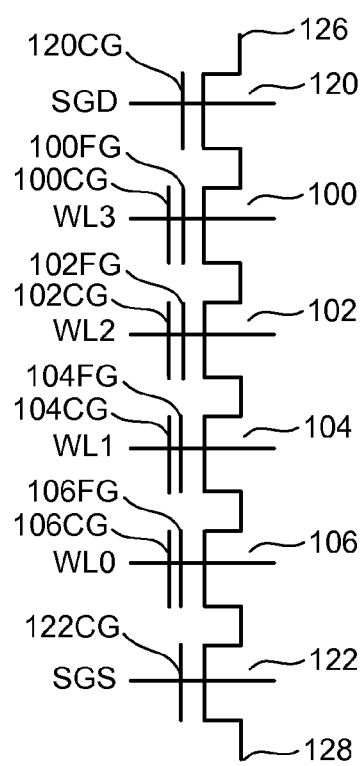
FIG. 2 is an equivalent circuit diagram of the NAND string depicted in FIG. 1.
Figure 3:
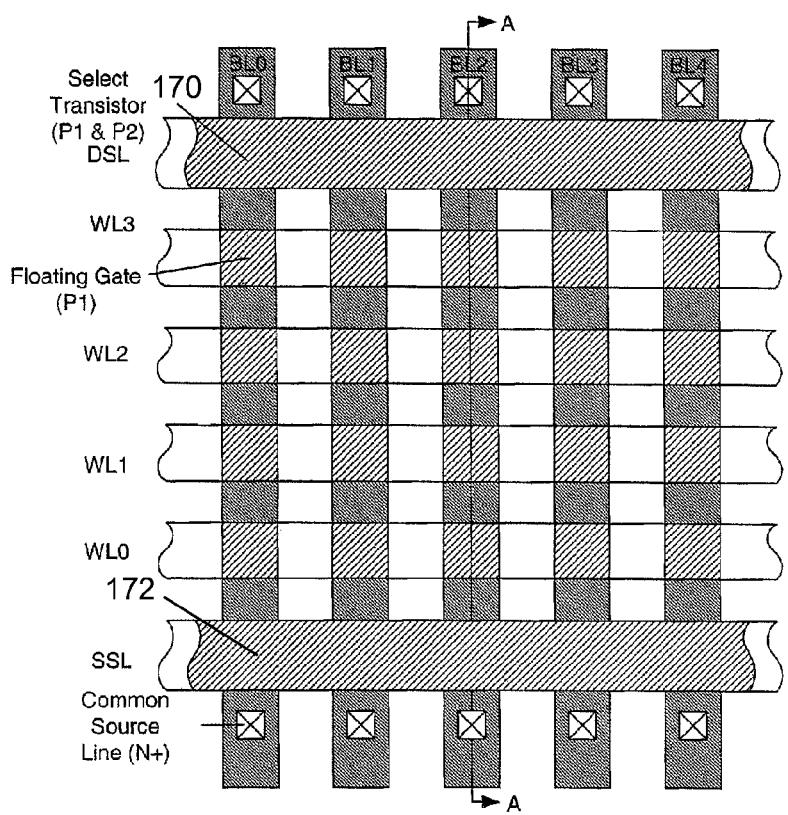
FIG. 3 is a plan view of a portion of a NAND flash memory array.
Figure 4:
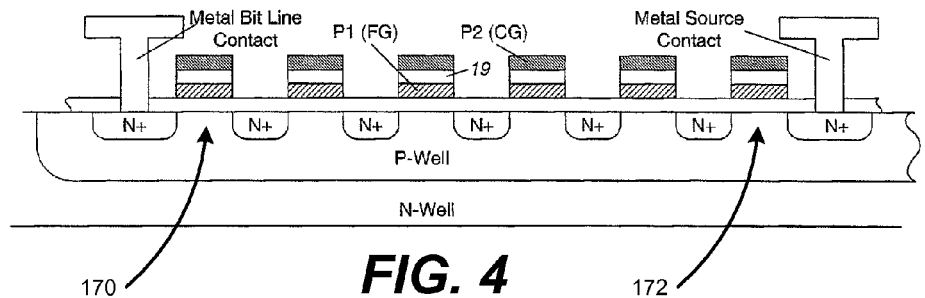
FIG. 4 is an orthogonal cross-sectional view taken along line A-A of the portion of the flash memory array depicted in FIG. 4.

A portion of a traditional NAND memory array is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
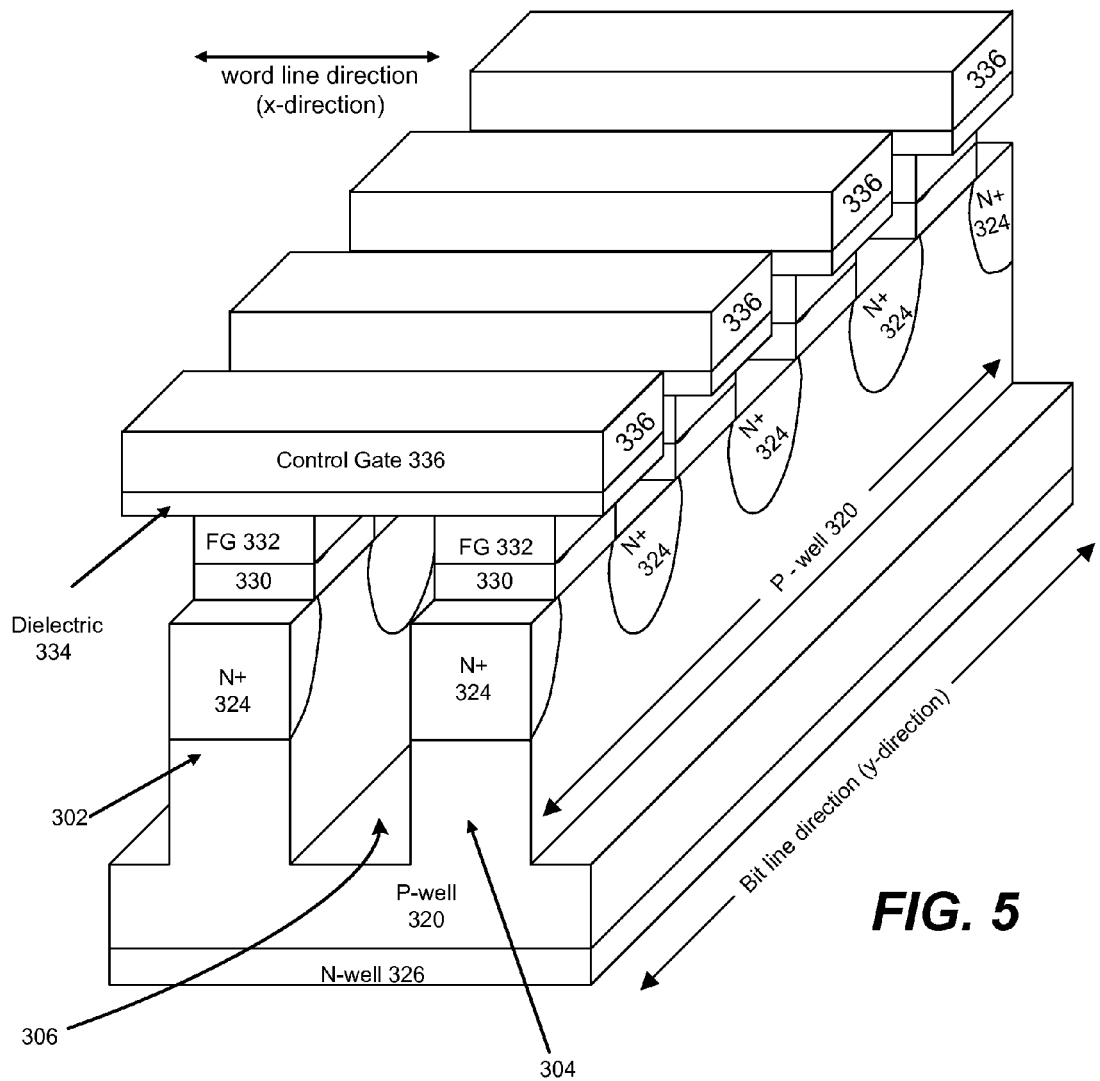
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by an open area or void 306. Typically, an insulating material or dielectric is formed between adjacent NAND strings in this open area.

Figure 6:
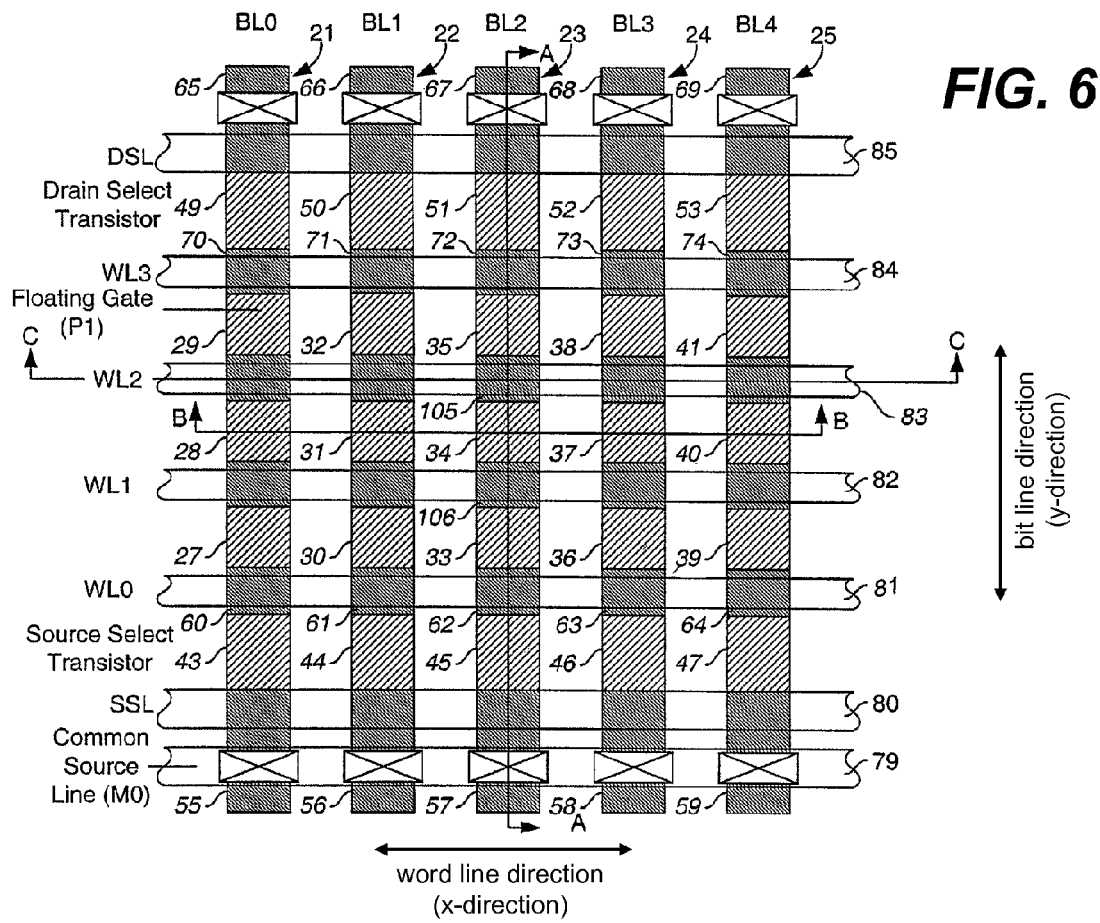
FIG. 6 is a plan view of a portion of a NAND flash memory array having a dual control-gate structure.

A NAND memory array having two control gates per memory cell is illustrated in plan view in FIG. 6. Five NAND strings 21-25 of series connected memory cells are included, with three floating gates or charge storage elements shown in each string. String 21 includes floating gates 27, 28, 29, string 22 includes floating gates 30, 31, 32, string 23 includes floating gates 33, 34, 35, string 24 includes floating gates 36, 37, 38, and string 25 includes floating gates 39, 40, and 41. Only a small rectangular array of fifteen memory cells is illustrated for ease of explanation. Actual implementations of such an array would typically include millions of such memory cells forming thousands of NAND strings, each string normally having 16, 32 or more memory cells.

Each NAND string includes two select transistors, one at each end of the string, to controllably connect the string between a different one of global bit lines BL0-BL4 and a common source line. A voltage is applied to respective source select gates 43-47 to control connection of one end of their respective memory cell strings 21-25 to the common source line. The other ends of the strings 21-25 are connected through respective drain select transistors 49-53 to the respective bit lines BL0-BL4. Column control circuitry applies a voltage to each bit line that is representative of the specific data to be written, or to sense the voltage or current of a corresponding string or memory cell during a read or verify operation. The select transistors include respective source and drain regions 55-64 and 65-74 in a semiconductor substrate.

Control gate (word) lines 81-84 are positioned between the floating gates instead of on top of them as in traditional NAND memory arrays. Each control gate line extends across multiple strings of memory cells and is capacitively coupled through a suitable insulating dielectric, such as multi-layer oxide-nitride-oxide (ONO), to the floating gates on both sides. Additional coupling area is obtained by using the sidewall areas of both sides of the floating gates. The floating gates can be made thicker (higher) than usual in order to increase this coupling area, and the control gates in between them are then made to be at least as thick as the floating gates in order to take advantage of the added coupling area. An advantage is that this coupling area may be controlled largely independent of the coupling area of the floating gates and the substrate, resulting in a desirably high coupling ratio even as the coupling area of the floating gates with the substrate is reduced during decreases in device dimensions. The principles, devices and techniques disclosed hereinafter can be used with traditional NAND architectures having word lines positioned above floating gates, or architectures having word lines between the floating gates as shown in FIG. 6.

Two control gate or word lines replace a single word line of conventional NAND arrays in FIG. 6. For example, the word line that would extend across the row of floating gates 27, 30, 33, 36 and 39 in a conventional array is replaced by two control gate lines 81 and 82 (WL0 and WL1). Similarly, a word line that would normally extend across the row of floating gates 28, 31, 34, 37 and 40 is replaced by two control gate lines 82 and 83 (WL1 and WL2). The control lines 81-84 are elongated in the x-direction across the array and separated in the y-direction by the length of the intervening floating gates and the thicknesses of the dielectric layers between them. Although the size of the memory floating gate is typically made as small as the photolithography allows in both x and y dimensions, the channel length of the select transistors 43-47 and 49-53 (y-dimension) is typically slightly larger than the minimum feature size to ensure it can effectively block all conduction including leakage when the maximum voltage is applied across it.

Figure 7:
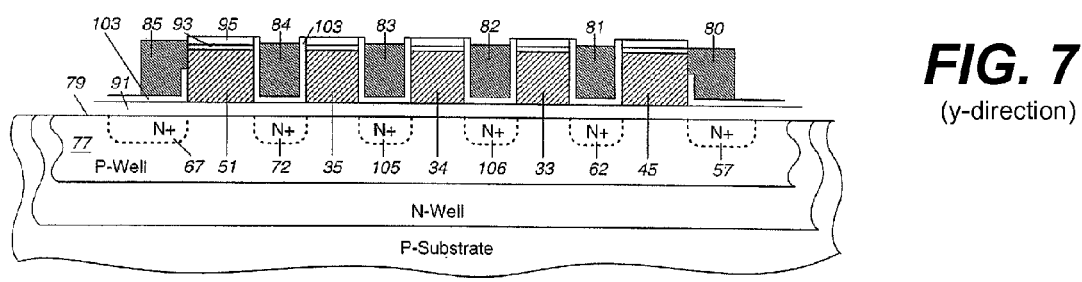
FIG. 7 is an orthogonal cross-sectional view taken along line A-A of the portion of the flash memory array depicted in FIG. 6.
Figure 8:
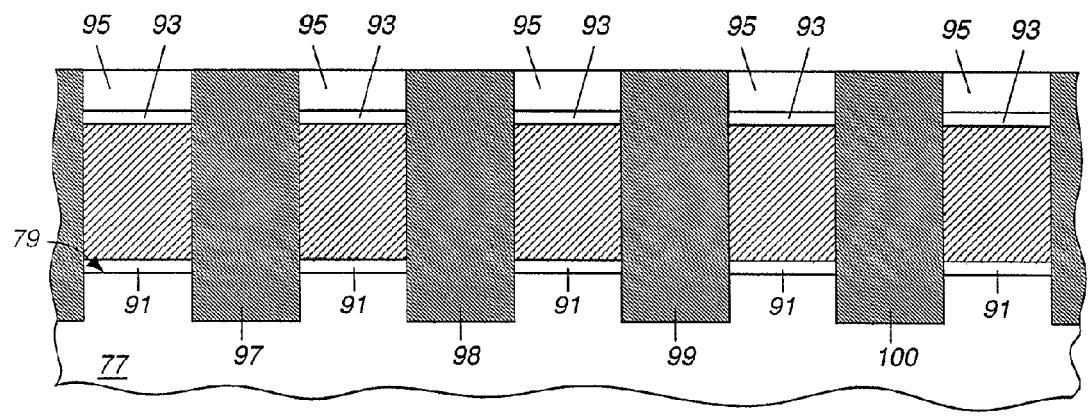
FIG. 8 is an orthogonal cross-sectional view taken along line B-B of the portion of the flash memory array depicted in FIG. 6.
Figure 9:
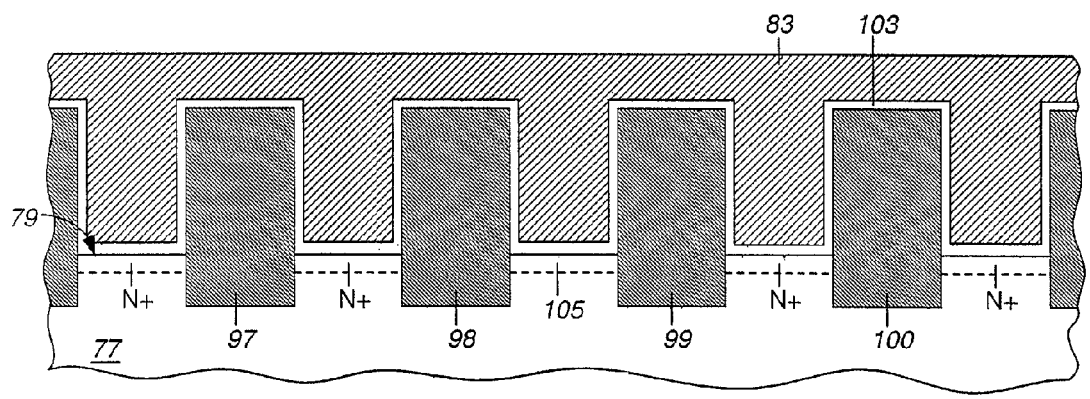
FIG. 9 is an orthogonal cross-sectional view taken along line C-C of the portion of the flash memory array depicted in FIG. 6.

FIG. 7 is an orthogonal cross-sectional view of the array shown in FIG. 6 taken along line A-A in the y-direction through one string of memory cells. FIG. 8 is an orthogonal cross-sectional view of the array taken along line B-B in the x-direction along a row of memory cells extending across multiple strings. FIG. 9 is a cross-sectional view of the array taken along line C-C in the x-direction along a word line. A layer 91 of tunnel dielectric (e.g., silicon oxide, $SiO_2$) is formed on the surface 79 of the substrate 77 to a thickness of about 8 nm. A first layer of the charge storage material (e.g., doped polysilicon) is formed over at least the area of the array from which the floating gates 51, 35, 34, 33 and 45 are formed.

Electrical isolation is provided between columns of floating gates by Shallow Trench Isolation (STI). The exposed substrate surface is anisotropically etched to form trenches 97-100 elongated in the y-direction and positioned between the polysilicon/dielectric stack strips in the x-direction. These trenches are etched to a depth of 100-300 nm in one embodiment. In other embodiments, trench depths of up to 1000 nm, 2000 nm or more can be used.

Additional trenches can be formed alongside the first polysilicon strips with lengths in the x-direction. Over the active regions these trenches extend the full height of the floating gate plus the thickness of masking layers 93 and 95, and over the field regions they will extend 100-200 nm. The control gate lines 81-84, select gate lines 80 and 85, and source and bit line contacts are formed in these trenches. Before forming these control gate lines, ions are implanted in the trenches, shown in the cross-sectional view of FIG. 7 as memory transistor and select gate implanted source and drain regions 67, 72, 105, 106, 62 and 57. A dielectric layer 103 is formed over the exposed surfaces of the structure, conforming to the sidewalls and bottom surfaces of the newly formed trenches. The layer 103 is ONO but may also be a material having a higher dielectric constant.

A second layer of doped polysilicon is deposited over the array area, completely filling the trenches and contacting the dielectric layer 103. This polysilicon is then removed from the top of the structure by CMP, resulting in control gate lines 81-84, the SSL line 80, and the DSL line 85. These lines are made to extend at least as high as the floating gates to which they are capacitively coupled through the dielectric layer 103.

Figure 10:
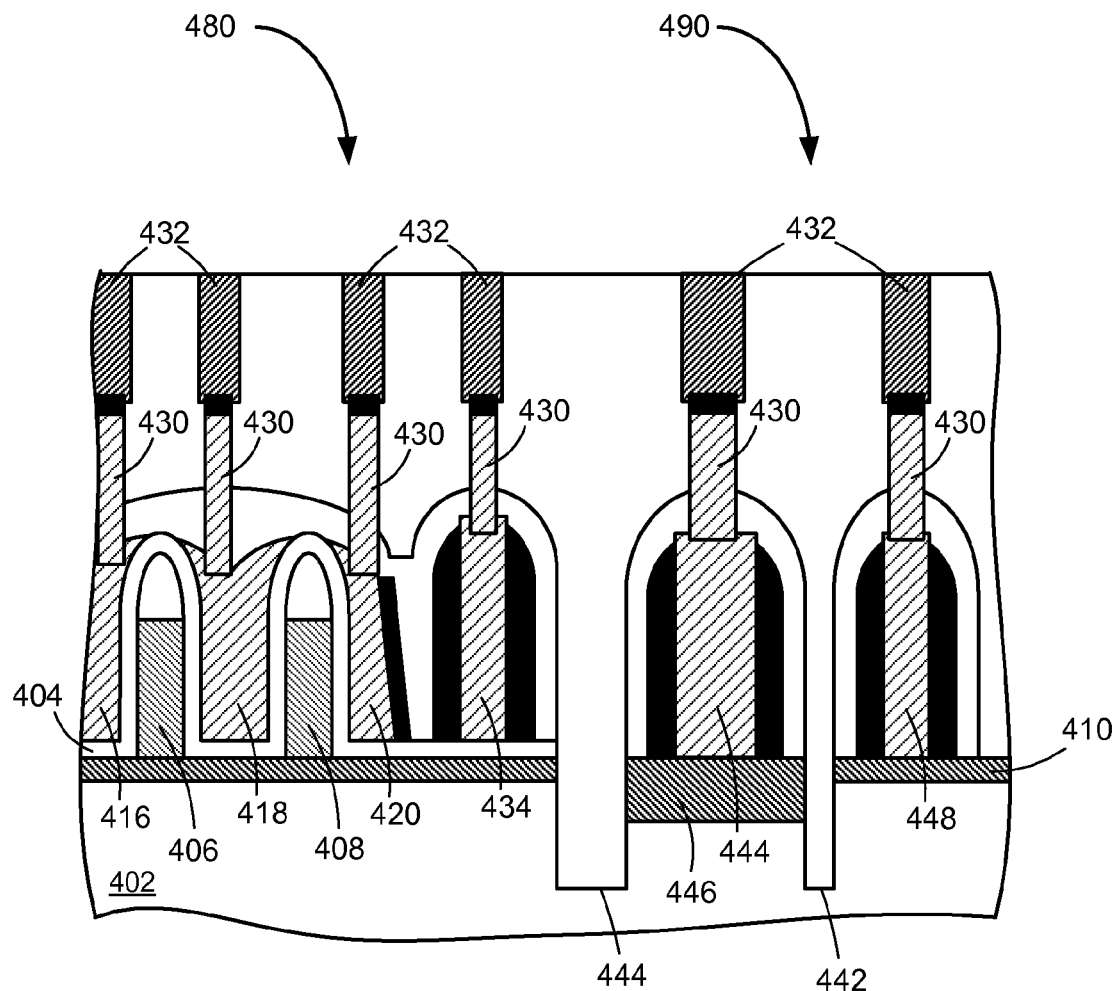
FIG. 10 is an orthogonal cross-sectional view through a portion of a NAND string of flash memory cells depicting a select transistor and peripheral circuitry fabricated in accordance with one embodiment.

FIG. 10 is an orthogonal cross-sectional view depicting a portion of a column of memory cells in a NAND memory array and a portion of peripheral circuitry for the array in accordance with one embodiment of the presently disclosed technology. At the memory array region 480, a first layer 410 of dielectric material, often referred to as a tunnel oxide because of the tunneling electron phenomenon and the frequent use of oxide, is formed over substrate 402. The tunnel dielectric layer extends in the column direction with a thickness in the direction vertical to the surface of the substrate. The portion of the depicted NAND string includes two charge storage regions 406 and 408, which can be conductive floating gates or some other suitable storage region. Although two charge storage regions are depicted, the NAND string may include any number of regions as previously described. The charge storage regions are aligned over the tunnel dielectric with spaces between floating gates adjacent in the column direction. Hard masks 414 overlie the upper surfaces of the floating gates.

The array is a dual control gate structure, having control gates positioned between adjacent floating gates and separated from the sidewalls thereof by an intermediate dielectric film 404. The intermediate dielectric film is often referred to as an inter-poly dielectric film or layer (IPD) because of its relation between the polysilicon floating and control gates. Often the intermediate dielectric is formed from more than one layer, frequently comprising a triple layer of oxide-nitride-oxide (ONO). Use of the term layer in the present disclosure should not be taken in a limiting sense to mean a single layer of material as for instance, the term intermediate dielectric layer is often referred to as a layer when in fact, multiple layers are used. In the depicted portion of the array, control gate 416 is adjacent to charge storage region 406. Control gate 418 is adjacent to charge storage region 406 and 408. Control gate 420 is adjacent to charge storage region 408. Charge storage region 406 is controlled by both control gates 416 and 418. Charge storage region 420 is controlled by both control gates 418 and 420. Connection lines 430 connect the control gates to contacts 432.

A select transistor for the NAND string is adjacent to the last or end charge storage region 408 of the string. The select transistor includes a gate region 434 separated from the substrate surface by the intermediate dielectric layer 404 and the tunnel dielectric layer 410. A connection line also connects gate 434 to a contact 432. Under the orientation depicted with respect to line A-A of FIG. 6, the depicted transistor is a drain select transistor. A similar source select transistor exists at the other end of the NAND string. Notably, the gate 434 of the select transistor is formed from the same layer of material as the control gates for the storage elements, e.g., polysilicon, and does not include any portion formed from the layer of material used to form the charge storage regions. When forming the charge storage regions, the first layer of polysilicon is removed from the portion of the substrate on which the select gates are to be formed. This allows a more simple construct for the select gate transistor that can be contrasted from prior art memory devices in which the select gates actually include two gate regions (one formed of the charge storage layer and one from the control gate layer) that are shorted together to form a single electrical gate region. A connection line 430 also connects gate 444 to a contact region 432.

An isolation trench 440 is formed in the substrate adjacent to the select gate to provide electrical isolation between the active area under gate region 434 and the active area under gate region 444 of a first peripheral transistor located at a portion of the substrate set aside for peripheral circuitry. The isolation trench is filled with a suitable insulating material such as silicon oxide. The first peripheral transistor is formed over a gate dielectric region 446 in addition to the first layer of dielectric material 404. Prior to forming the first layer of dielectric material, the dielectric region can be formed so that high voltage transistors can be fabricated with a thicker gate dielectric. The dielectric region can be deposited using known patterning techniques or grown using known growth processes. It is observed that the intermediate dielectric layer is not present at the peripheral circuitry region. As part of fabrication, the intermediate dielectric is removed prior to forming the layer of conductive material from which the control gates and peripheral gate regions are formed.

Another isolation trench 442 is formed in the substrate adjacent to the first peripheral transistor to provide electrical isolation between the active area under gate region 444 and the active area under gate region 448. The second transistor in the peripheral circuitry region does not include an additional dielectric region as with the first peripheral transistor. Gate region 448 is separated from the substrate surface by the tunnel dielectric layer 404. A connection line 430 connects gate 448 to a contact 432.

As with the select gate transistor, the gate regions 444 and 446 of the peripheral circuitry transistors are formed from the material used in forming the control gates of the memory cells. These gates do not include the material used in forming the charge storage regions. During fabrication, the charge storage material is removed from the peripheral circuitry area when etching the individual charge storage regions. Additionally, the intermediate dielectric layer is removed. As such, the peripheral circuitry regions include gates formed of the control gate material that are separated from the surface of the substrate by the tunnel dielectric layer and any additional gate dielectric regions that may be formed.

Figure 11:
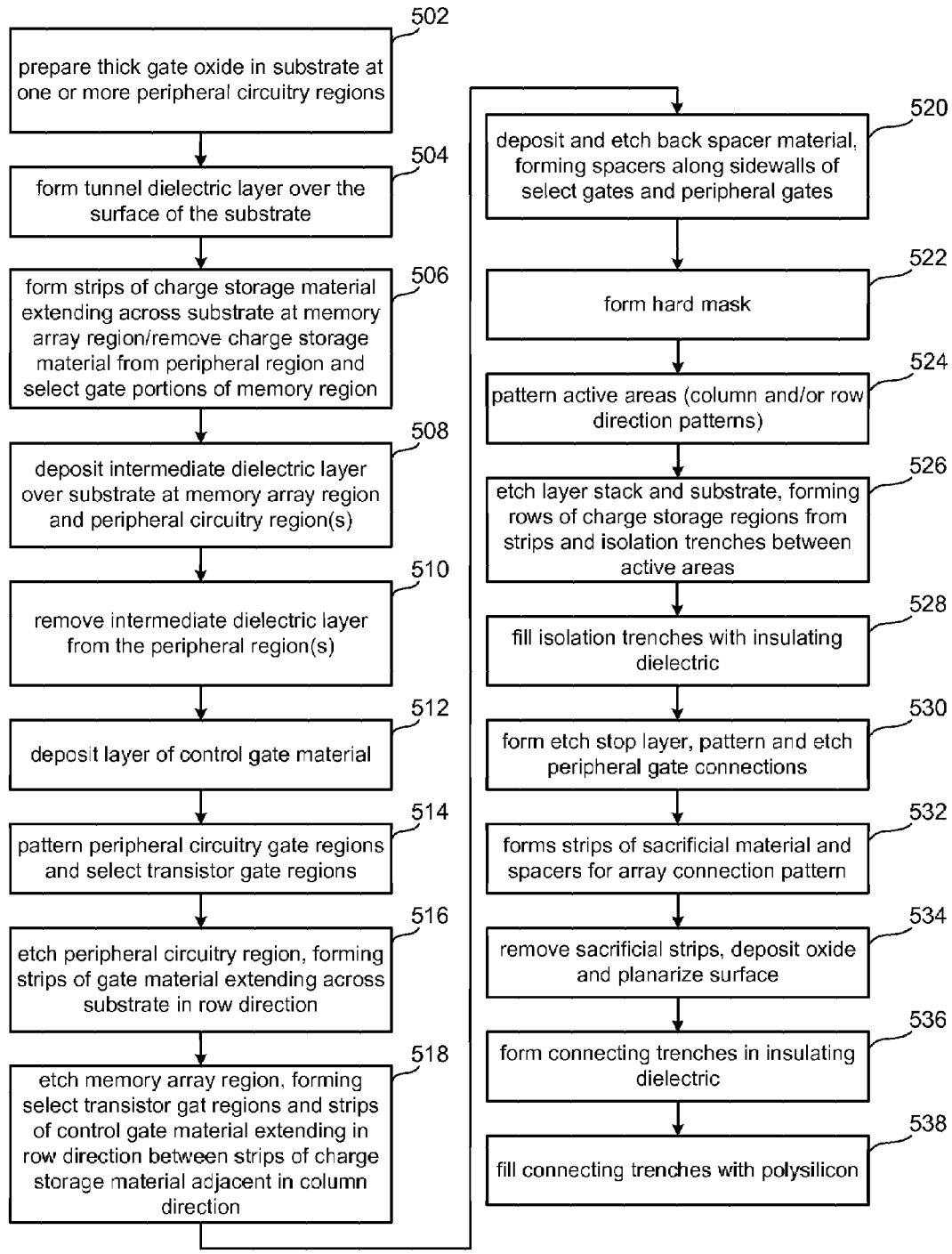
FIG. 11 is a flowchart describing a method of fabricating non-volatile flash memory in accordance with one embodiment.

FIG. 11 is a flowchart describing a method of fabricating a non-volatile memory array in accordance with one embodiment of the disclosed technology. At step 502, a high voltage gate dielectric material is formed in and/or over a substrate. The high voltage gate dielectric material is typically, but not necessarily, an oxide deposited using a mask to position the dielectric material at one or more areas of the substrate set aside for peripheral circuitry such as high voltage transistors, logic transistors, etc. The peripheral circuitry can form the row or column control circuitry for the array. Other gate dielectric materials can be used as well as various formation processes such as oxidation growth processes for example. It is noted that the high voltage gate dielectric is not necessarily formed at all areas of the substrate set aside for peripheral circuitry.

At step 504, one or more layers are of a tunnel dielectric material are formed over the surface of the substrate. The tunnel dielectric material is typically, but not necessarily, an oxide deposited over the substrate surface. The tunnel dielectric is formed at an area of the substrate to become the memory array region in addition to the one or more areas for peripheral circuitry.

Strips of charge storage material are formed over the surface of the substrate at step 506, with the tunnel dielectric material formed therebetween. The charge storage material is typically formed by depositing one or more layers of charge storage material such as a conductive polysilicon floating gate material. The charge storage material is patterned, for example, by forming strips of photoresist or strips of spacer material elongated in a first direction across the surface of the substrate. The first direction is the intended direction of the rows of memory cells, corresponding to word line direction of the memory array. The layers are etched using the photoresist or spacer pattern as a mask to define strips of the charge storage material that are elongated in the row direction over the tunnel dielectric layer. In one exemplary embodiment, the strips of charge storage material are formed with a thickness of 800 A and a dimension in the column direction of 300 A. Other dimensions and thicknesses can be used.

In one embodiment, forming the strips of charge storage material includes depositing the material at the memory array region of the substrate, including portions thereof to become select gate transistors, as well as one or more peripheral circuitry regions. The peripheral circuitry regions and the select gate portions of the memory array region are not patterned so that etching removes all or substantially all of the charge storage material from these parts of the substrate.

An intermediate dielectric material is formed over the strips of charge storage material at step 508. The intermediate dielectric is often, but not required to be, a triple layer of oxide-nitride-oxide (ONO) that is deposited along the exposed sidewalls of the strips of charge storage material extending in the row direction. The intermediate dielectric will also extend between strips of the charge storage material that are adjacent in the column direction. The intermediate dielectric is formed over the memory array region and the peripheral circuitry region of the substrate, including the previously formed high voltage gate dielectric area(s).

The portion(s) of the intermediate dielectric at the peripheral circuitry region(s) is removed at step 510. A hard mask can be formed over the array region in one embodiment by depositing the hard mask material over the substrate and patterning the memory array region with photoresist for protection. Non-selective etching can be used to strip the dielectric material from the peripheral region(s) in one embodiment.

After removing the intermediate dielectric material, a layer of control gate material is formed over the memory array region and peripheral circuitry region(s) at step 512. A layer of conductive material such as doped or undoped polysilicon can be deposited in one embodiment. At step 514, a masking pattern is applied over the control gate layer at the peripheral circuitry region(s). Strips of photoresist can be patterned using conventional photolithography techniques to define the gate pattern for the various peripheral circuits. Using the photoresist as a mask, the control gate layer at the peripheral region is etched at step 516 to define the gate length(s) for the peripheral circuit(s). Etching at step 516 forms one or more strips of the control gate material that extend in the row direction across the substrate. Etching proceeds until the tunnel dielectric layer is reached at areas where the intermediate dielectric material was removed. If any peripheral circuitry gates are formed over the intermediate dielectric material, etching at those areas proceeds until the intermediate dielectric is reached.

At step 518, the control gate layer at the memory array region is etched. Note that etching at step 516 and step 518 can be performed simultaneously. Because the memory array region was not patterned at step 514, the extent of the control gate layer at this portion is etched. Selective etching for polysilicon with respect to the oxide intermediate and tunnel dielectric layers can be used in one embodiment. Selectively etching can recess the polysilicon between adjacent strips of the charge storage material, thereby forming individual strips of the control gate material. As earlier described, the control gates between adjacent charge storage regions are shared by the two adjacent regions. In the column direction, each control gate strip is separated from the corresponding strip of charge storage material by the intermediate dielectric layer. In the vertical direction (with respect to the substrate surface), the strips are separated from the surface of the substrate by the tunnel dielectric layer and the intermediate dielectric layer.

At step 520, spacers are formed along the sidewalls of the strips of control gate material at the peripheral circuitry region(s) and along the sidewalls of the strips of control gate material corresponding to last control gate strips for each string. A spacer is formed along the exposed sidewall of the control gate strip adjacent to the drain side select gates and the exposed sidewall of the control gate strip adjacent to the source select gates. A layer of oxide is deposited over the substrate, including the memory array and peripheral circuitry regions, in one embodiment, followed by etching back the oxide to form the spacers.

A hard mask layer, e.g., silicon nitride, is formed over the substrate at step 522. The active areas are patterned at step 524, for example using strips of photoresist extending in the row and/or column direction. A first strip of photoresist is applied over the memory array region, including the select gates. Additional strips of photoresist are deposited over the individual gate regions at the peripheral circuitry region. Areas between gate regions of the peripheral circuitry that are adjacent in the column direction are left unpatterned so electrical isolation between the devices can be provided.

The pattern applied at step 524 can also facilitate the formation of multiple devices from the strips extending in the row direction and electrical isolation therebetween. At the memory array region for example, the pattern can cover portions of the layer stack to become columns or NAND strings of memory cells. The hard mask will not be patterned at locations between columns. Similarly, the pattern can leave the hard mask exposed at locations along the strips of gate material for the peripheral circuitry to form multiple devices in the row direction from the strips. Spacer-assisted, nonimprint technologies can ale be used in forming the patterns for etching.

After applying the pattern of photoresist, the exposed portions of the hard mask are etched at step 526. After removing the photoresist, the remaining portions of the hard mask are used as a mask to etch the underlying layers and/or the substrate. Along the column direction, etching proceeds through the hard mask, the intermediate dielectric, tunnel dielectric, high voltage gate dielectric and into the substrate. An isolation trench is thus formed in the substrate between the gates of peripheral devices adjacent in the column direction. Along the row direction, the layers are etched followed by etching into the substrate. Etching the strips of charge storage material at the memory array region forms individual charge storage regions separated in the row direction. Etching the substrate forms isolation trenches between columns of charge storage regions adjacent in the row direction. It is noted that while the above process has been described as using a single masking step followed by etching, multiple masking steps may be used, for example by applying one mask of photoresist strips extending in the row direction to provide isolation in the column direction. After etching, another mask can be applied that includes photoresist strips extending in the column direction to provide isolation in the row direction.

The isolation trenches are filled at step 528 with a suitable insulating material, such as a dielectric oxide deposited over the substrate. After applying a chemical mechanical polish to remove any excess film and provide a flat surface, an etch stop layer is formed over the insulating dielectric at step 530. The etch stop layer is patterned and etched to provide openings therein at locations over the gate regions of the peripheral circuitry.

Strips of sacrificial material extending in the row direction are formed at step 532. Sidewall spacers are formed along the strips. A hard masking layer, e.g., SiN, can be formed over the etch stop layer in one embodiment at step 532, followed by patterning and etching using photoresist to form the sacrificial strips. In one embodiment, the photoresist strips are positioned with a first sidewall aligned relative to a first row of control gates and a second sidewall aligned relative to a row of control gates adjacent to the first row. Strips can also be positioned with a first sidewall aligned relative to the last row of control gates and a second sidewall aligned relative to the gate portion of the select gate devices adjacent to the last row. Similarly, other strips can be positioned with a first sidewall aligned relative to the first row of control gates and a second sidewall aligned relative to the gate portion of the select gate devices adjacent to the first row of control gates. Using the photoresist as a mask, etching causes the sidewalls of the sacrificial strips to be aligned as described for the strips of photoresist. The spacers formed at step 532 are formed by depositing and etching back a layer of polysilicon in one embodiment. Conformal processes can be used to regulate the length of the spacers in the column direction. The spacers are formed in alignment with the underlying gate regions in one embodiment. For example, after aligning a first sidewall of a strip of SiN with respect to one row of control gates, the spacer formed thereon can be aligned over the underlying gate region. The sacrificial strips are removed at step 534, followed by forming another sacrificial layer, e.g., oxide, in the spaces between spacers that are adjacent in the column direction. The oxide can be planarized to form a substantially flat surface.

At step 536, connecting trenches are formed to provide access to the underlying gate regions. Using the oxide as a hard mask, the polysilicon spacers can be etched, followed by etching the insulating dielectric using the remaining polysilicon etch stop layer as a mask. Etching continues until the control gate material is reached at the memory array region and the peripheral circuitry region, forming trenches in the insulating oxide that reach to the gate regions.

At step 538, the connecting trenches are filled with a conductive material such as polysilicon formed by a suitable deposition process. Any excess polysilicon can be etched back to form a substantially planar surface. The polysilicon connecting lines can be subjected to salicidation if desired. A contact dielectric can be deposited and patterned to form contacts for the connections lines. Contact regions can be etched in the dielectric and filled with a suitable conductor for connecting to the connecting lines. Various back-end processes can then be performed to complete fabrication, including processing of metal layers, etc.

Figure 12A:
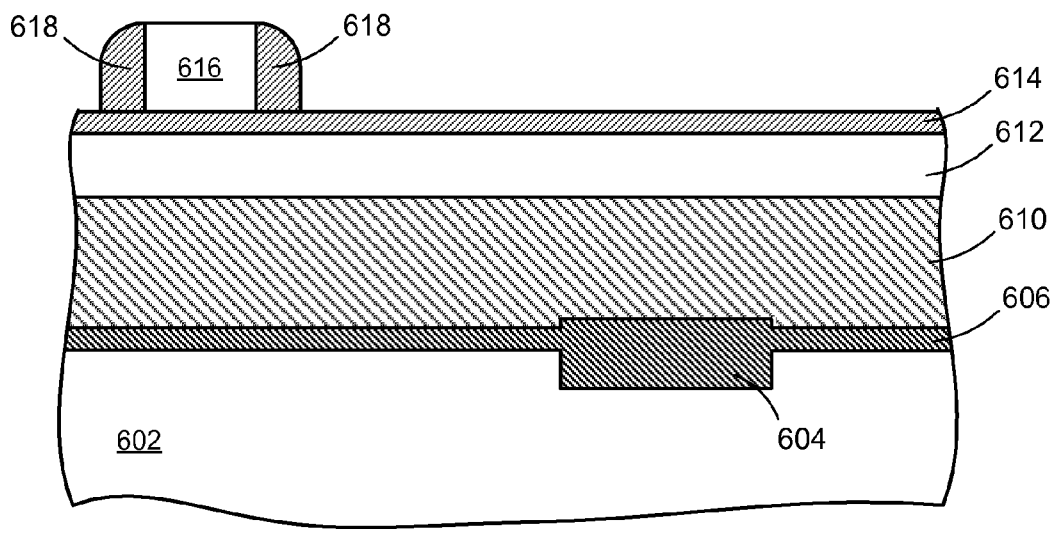
FIGS. 12A-12O are orthogonal cross-sectional views of a semiconductor substrate and layer stack depicting the fabrication of a non-volatile memory array and peripheral circuitry in accordance with one embodiment.
Figure 12B:
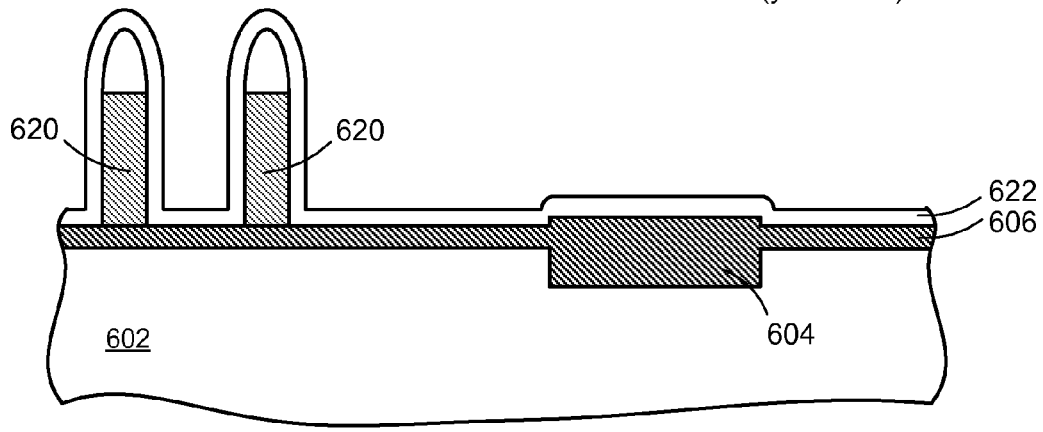
Figure 12C:
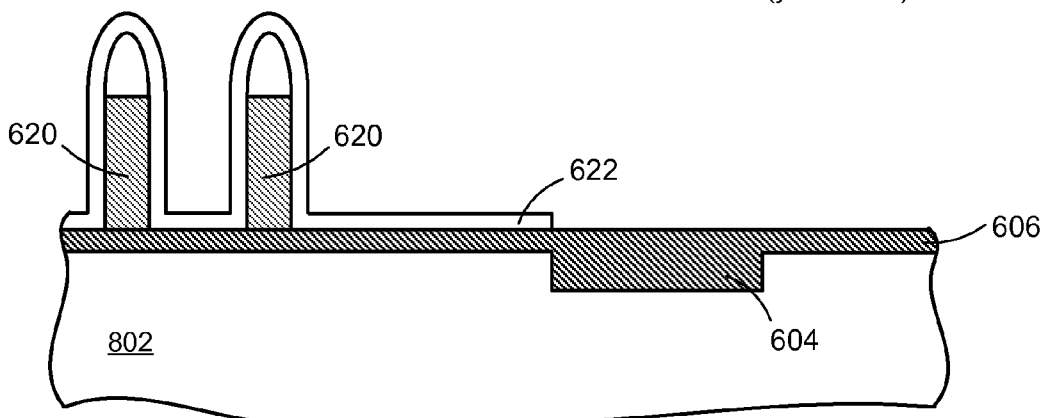
Figure 12D:
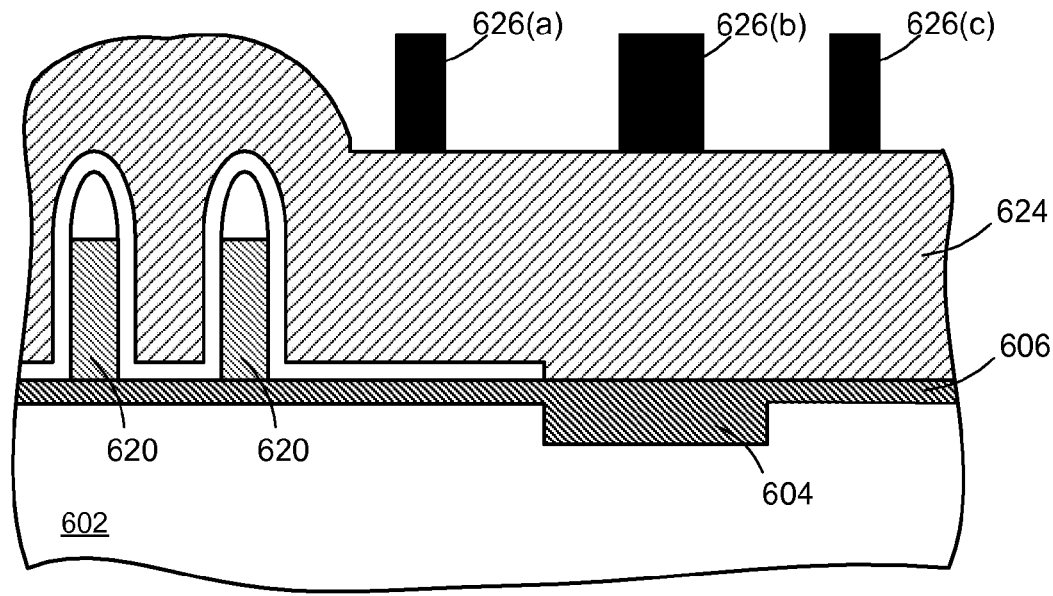
Figure 12E:
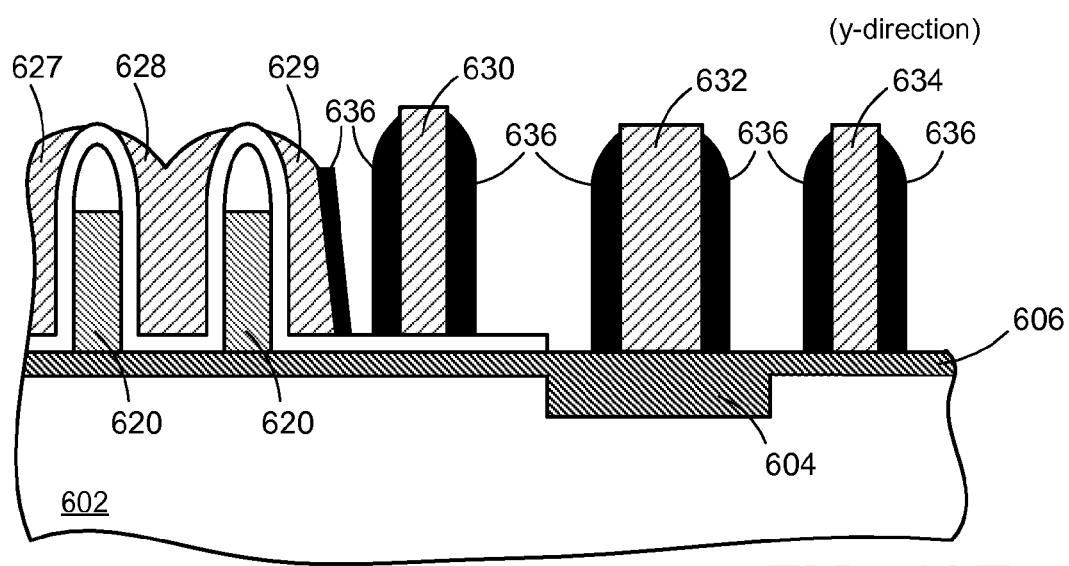
Figure 12F:
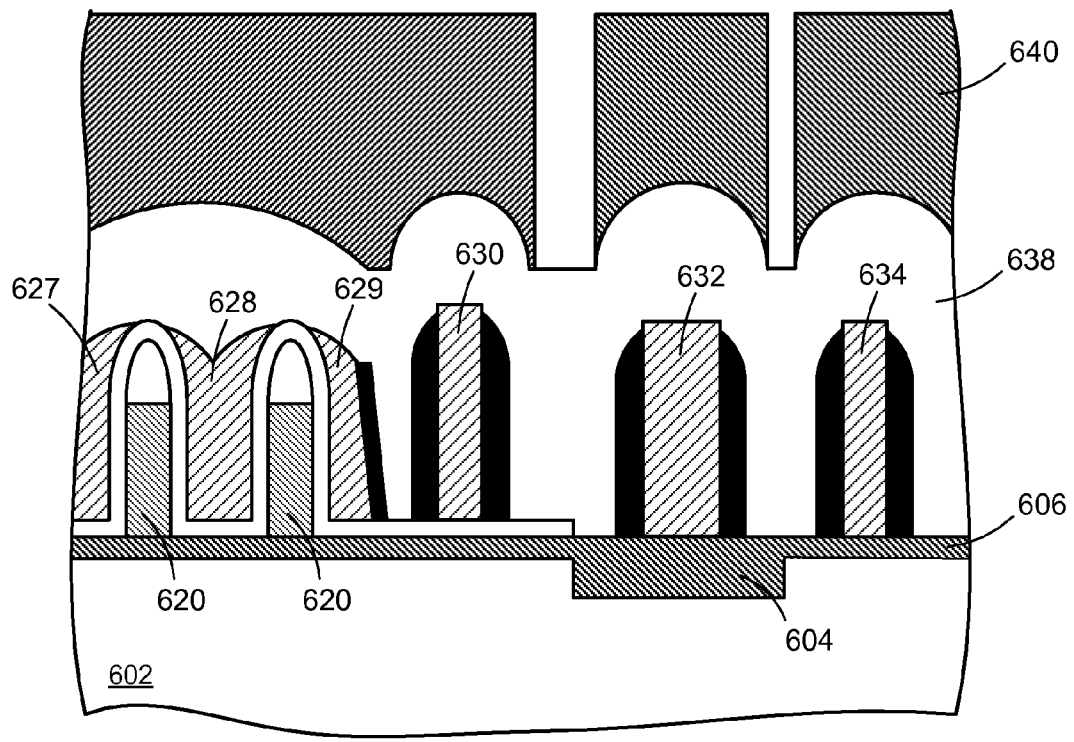
Figure 12G:
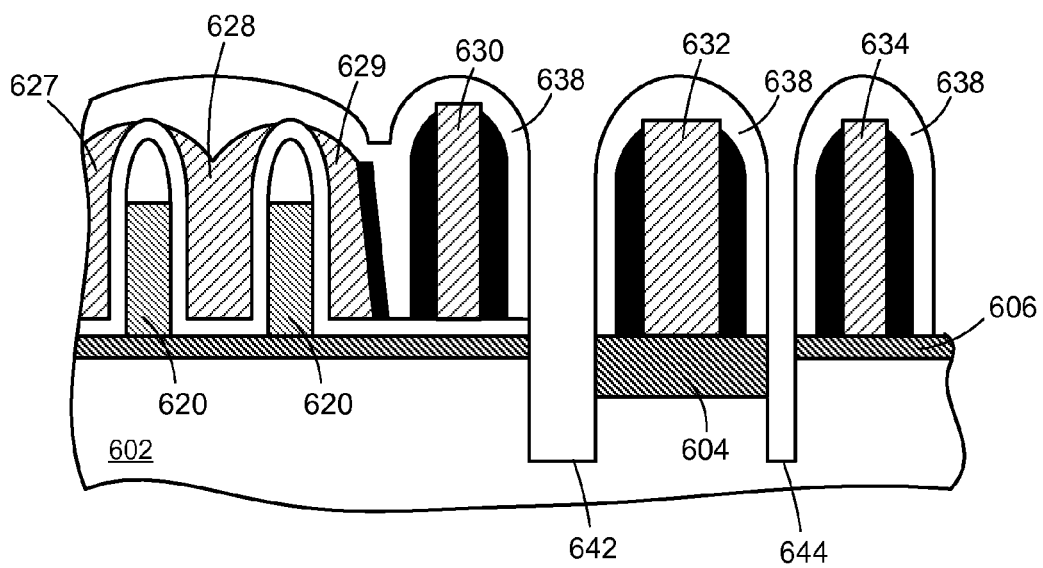
Figure 12H:
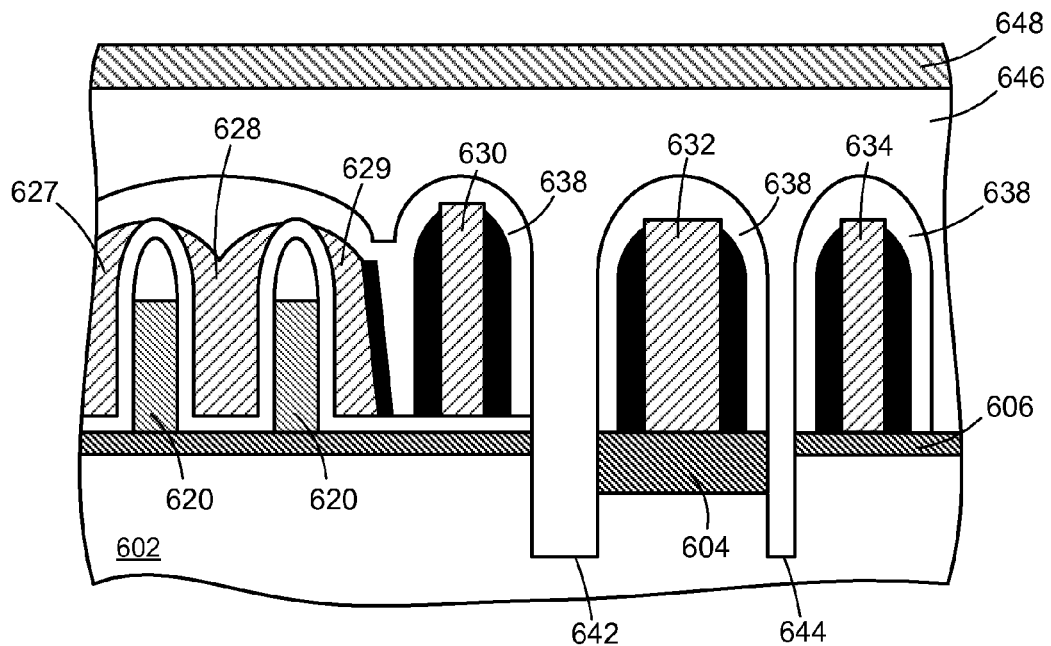
Figure 12I:
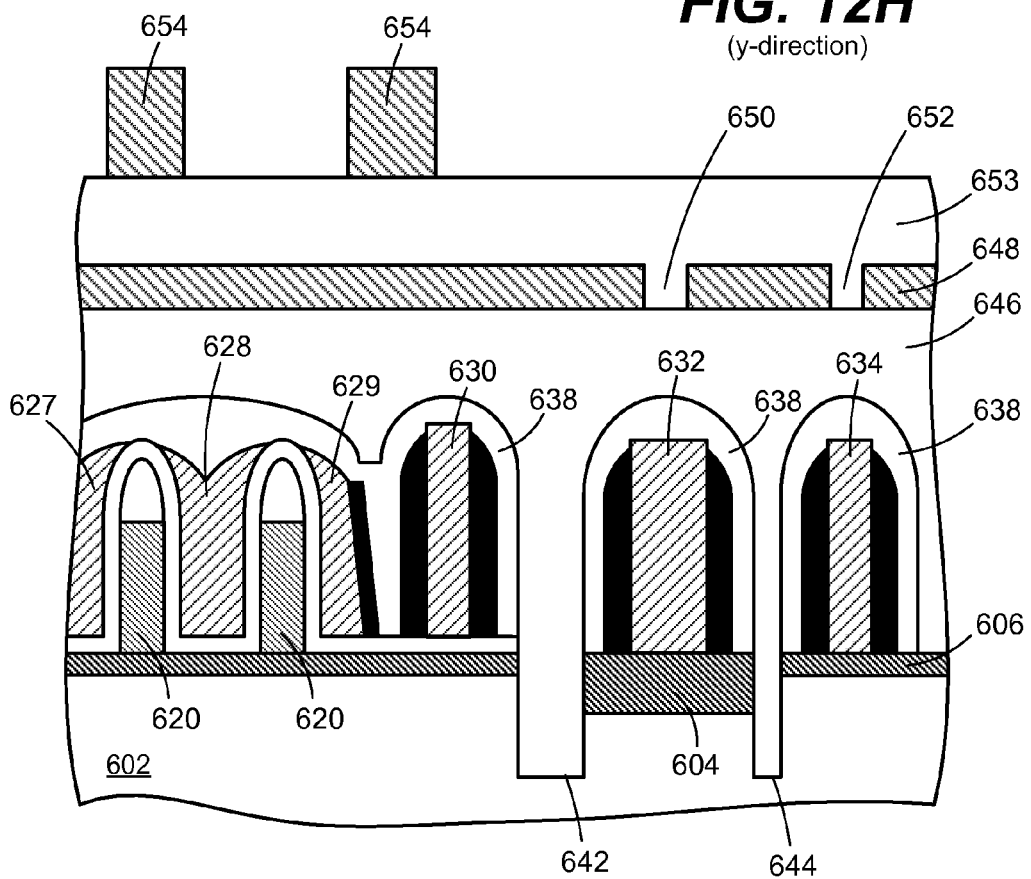
Figure 12J:
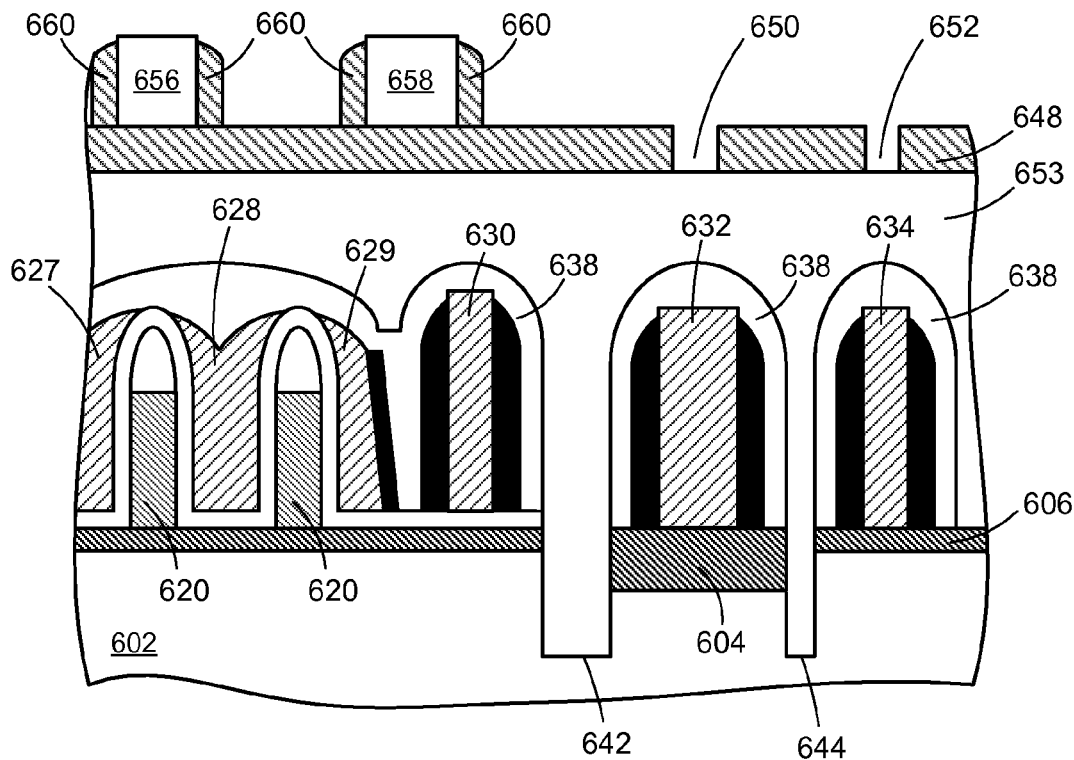
Figure 12K:
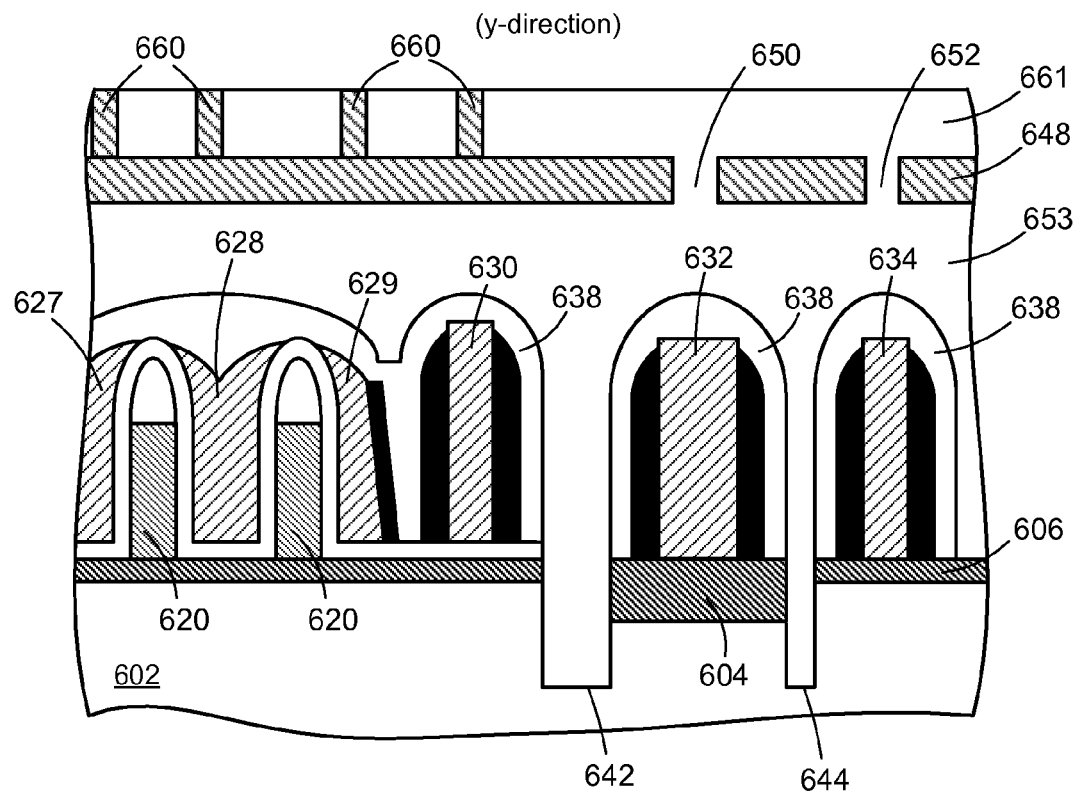
Figure 12L:
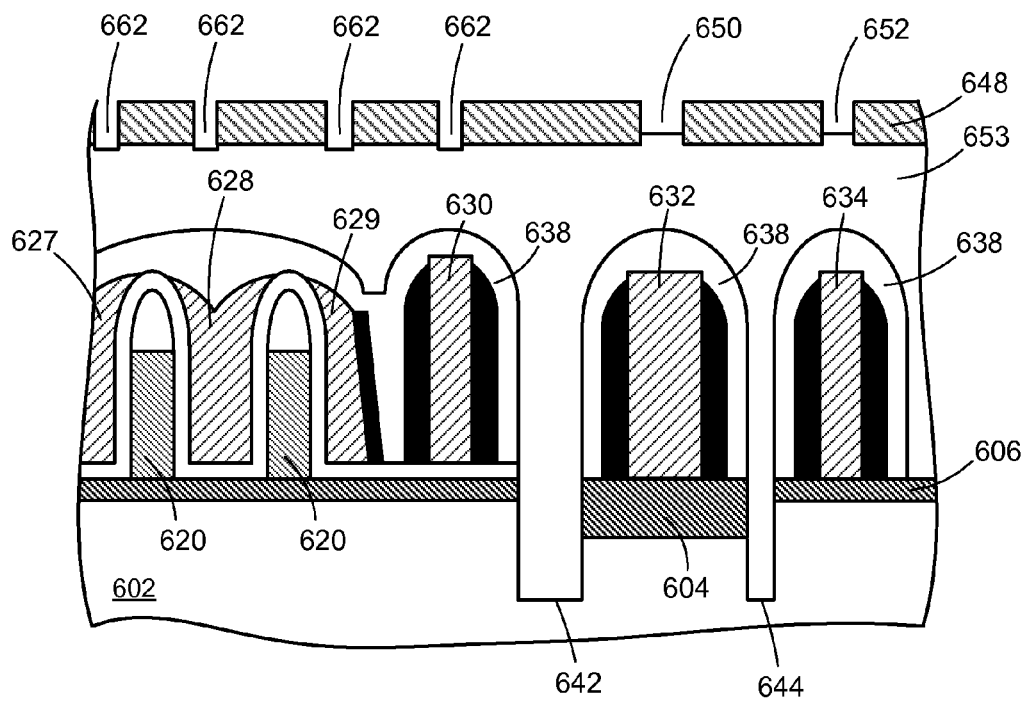
Figure 12M:
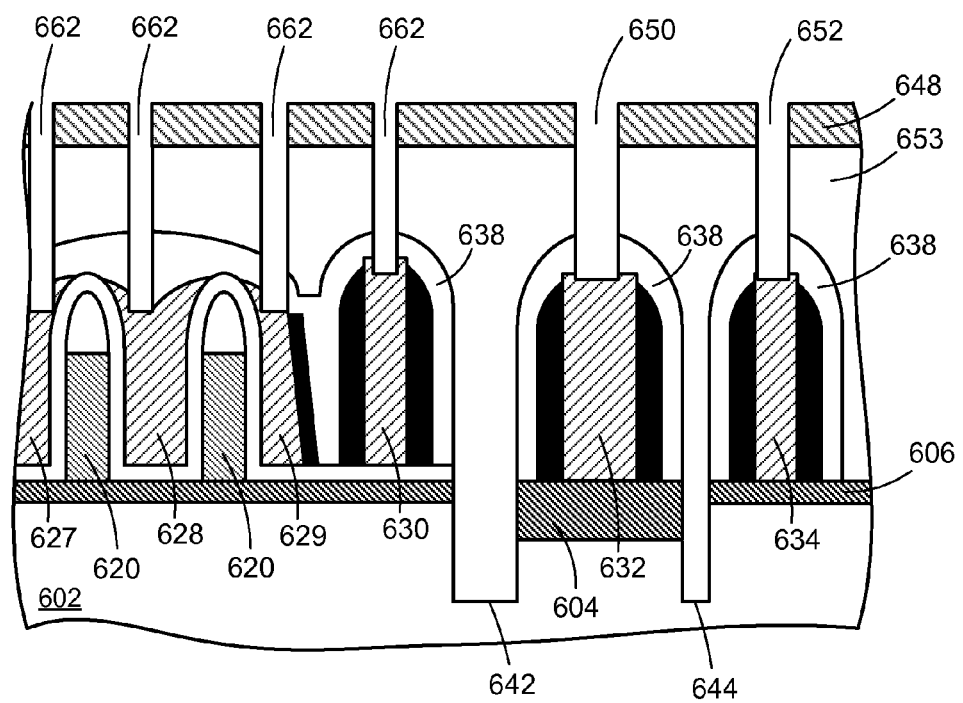
Figure 12N:
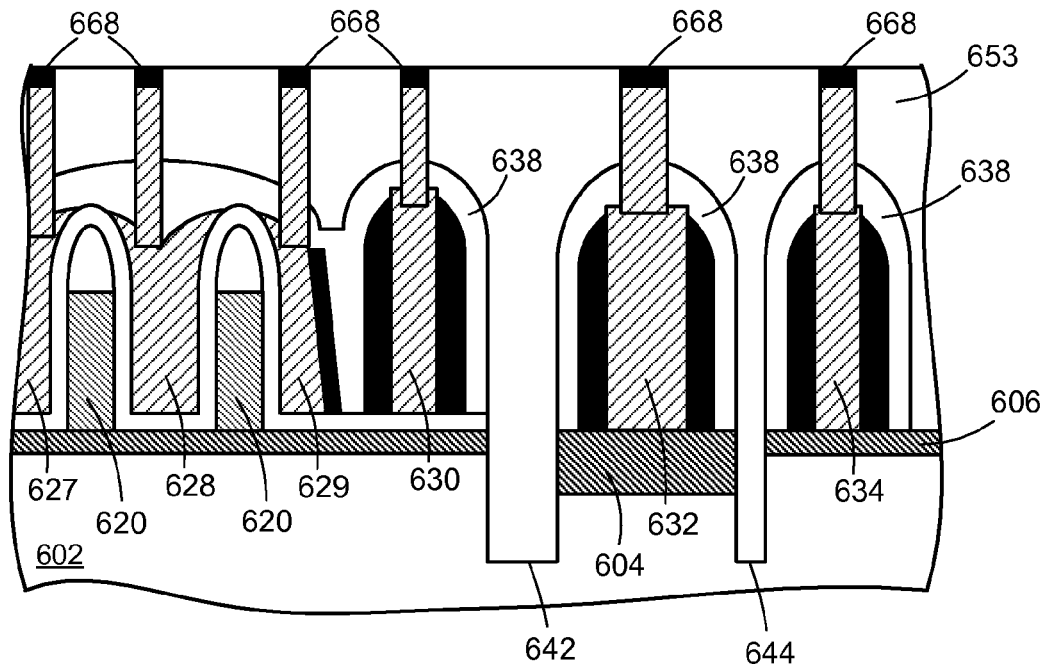
Figure 12O:
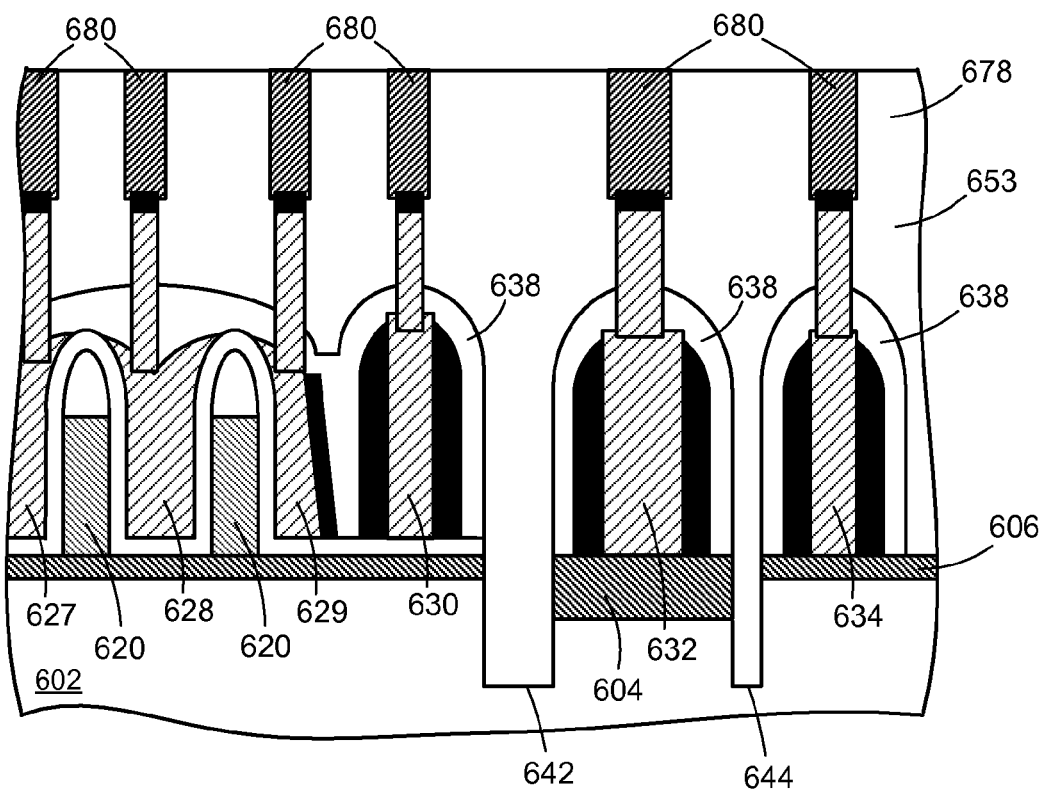

FIGS. 12A-12O are orthogonal cross-sectional views depicting the fabrication of a non-volatile memory array in accordance with one embodiment of the presently described technology. The described embodiment is exemplary only and should not be taken as limiting the disclosure. The exact materials, dimensions and order of processing may vary according to the requirements of a particular implementation. The described embodiment includes a dual control gate structure for the memory cells, but it will be appreciated that the technology may be used with traditional NAND arrays, including those with composite charge storage structures.

FIG. 12A is a cross-sectional view taken along a line in the column or y-direction through a portion of a memory array and peripheral circuitry undergoing fabrication, such as through line A-A depicted in FIG. 6. One or more wells (e.g., a triple well), not shown, are typically formed in the substrate 602 prior to forming the layer stack over the substrate surface. The term substrate may include reference to these well regions. After implanting and associated annealing of the well(s) to dope the substrate, high voltage gate dielectric region 604 is formed in the substrate. The gate dielectric region extends in the row direction across the substrate and can be formed in one embodiment by growing a thick layer of SiO2 in the substrate to a depth of about 340 A. A deposition process could alternately be used to form dielectric region 604, for example by depositing the oxide and patterning and etching to remove the oxide from areas of the substrate other than the gate regions. Although FIG. 12A depicts a single high voltage gate region, other embodiments may include additional high voltage dielectric regions for other peripheral circuitry.

A layer 606 of tunnel dielectric material is formed over the substrate surface after forming the gate oxide region. Oxides are typically, although not necessarily, used for the tunnel dielectric. Chemical vapor deposition (CVD) processes, metal organic CVD processes, physical vapor deposition (PVD) processes, atomic layer deposition (ALD) processes, thermal oxidation, or other suitable techniques can be used. In one embodiment, the tunnel oxide is about 8 A in thickness. A zero layer formation step, the formation of a pad oxide layer for example, may precede formation of the gate oxide.

A layer 610 of polysilicon or other charge storage material is then formed over the tunnel dielectric layer 610. It is noted that a layer may still be said to be over another layer when one or more interleaving layers are between the two layers, as well as when the two layers are in direct contact. In one embodiment, doped polysilicon is formed by low-pressure chemical vapor deposition (LPCVD), although other processes can be used. Different thicknesses of the charge storage layer can be used, for example, between about 50 A and 800 A in various embodiments. This thickness is greater than that of some NAND memories, with the result that the floating gates are thicker than those of some traditional devices.

A hard masking layer 612 is formed over the charge storage layer. The hard mask can include different materials such as a layer of high temperature oxide (HTO). In one embodiment, the hard mask includes a thin pad of silicon dioxide over which is formed a layer of silicon nitride. An optional assist layer 614 is formed over the hard mask. The assist layer provides a substantially matched material composition for spacers 618, which are formed along the substantially vertical sidewalls of a strip 616 of sacrificial material such as oxide. Strips 616 of oxide can be formed using conventional photolithography steps. Spacers 618 can be formed, e.g., by depositing and etching back a layer of polysilicon. The matched compositions of layer 614 and spacers 618 can provide an etch stop for removing the strips 616 of oxide and also provide better stability for the spacer after the sacrificial material is removed. No patterning is provided at the peripheral circuitry area so that the sacrificial material is removed prior to depositing and etching back the polysilicon spacers.

FIG. 12B depicts the substrate after etching the layer stack to form strips 620 of the charge storage material extending across the substrate in the row direction and depositing a layer 622 of dielectric material. The strips of charge storage material are formed by first removing the sacrificial strips 616, using a selective wet etch for example. The assist layer 614 can provide an etch stop for the wet etch process used to strip the sacrificial features. The assist layer can also provide a stable base for the subsequently formed spacers. For example, the material composition of the assist layer is chosen to provide adequate adhesion for the thinly formed spacers. A matched material composition for the spacers and assist layer facilitates adhesion between the spacers and the underlying layer. For example, the assist layer and spacer material are both polysilicon in one embodiment to improve the stability of the spacers when the sacrificial features are removed. Similar materials that are not exactly the same may also be used to improve adhesion of the spacers to their base layer. Using similar materials for the spacers and intervening layer can also help with stresses between the different films. If layers of different materials are used, the different materials may have different coefficients of thermal expansion causing stress at the interface of the different materials. When the same or similar materials are used, matching thermal coefficients can decrease stresses at the material interfaces. More details regarding the use of an assist layer 614 can be found in U.S. patent application Ser. No. 11/623,314, entitled "Method Of Forming Spacer Patterns Using Assist Layer for High Density Semiconductor Devices," by Pham, et al., filed Jan. 15, 2007.

The etch stop layer is etched after removing the sacrificial features, followed by etching the hard mask and charge storage materials until reaching the tunnel oxide. Portions of the hard masking layer 612 remain over the strips 620 of charge storage material. It is noted that at the peripheral region, the charge storage material has been completely removed through the etch processes. Dielectric layer 622 is formed after etching the strips of charge storage material. The dielectric layer is an intermediate or inter-gate dielectric, forming the separation between the resulting floating and control gate regions. The intermediate dielectric is a triple layer of oxide, nitride and oxide in one embodiment.

After forming the intermediate dielectric layer, the memory array region is masked (not shown), for example by depositing a masking layer and using photoresist to cover the array portion. The hard mask is removed from the non-array portions, followed by etching to remove the intermediate dielectric material. The mask is then removed, resulting in the substrate as depicted in FIG. 12C.

A control gate layer 624 is deposited over the substrate as shown in FIG. 12D. A second layer of polysilicon is typically used, but other conductive materials are possible as well. The select gate and peripheral gate regions are then masked using strips of photoresist with optional hard masking for example. A particular pattern is shown in FIG. 12D, however other embodiments may include different configurations for the peripheral circuitry as one would expect. The particularly disclosed embodiment includes a first strip 626(a) of photoresist forming the pattern for a select transistor gate region, a second strip 626(b) forming the pattern for a high voltage transistor gate region, and a third strip 626(c) forming the pattern for a transistor gate region not positioned over the high voltage gate oxide 604. No patterning is applied at the memory array region.

Using the strips of photoresist as a mask, the control gate layer is etched as depicted in FIG. 12E. A set of control gates including control gates 627, 628 and 629 is formed at the memory array region. The control gate layer is recessed between adjacent strips 620 of charge storage material, and separated therefrom by intermediate dielectric layer 622. By recessing the material, individual control gates are formed, extending across the substrate in the row direction. Using the photoresist strips as a mask, the control gate layer is etched at the select gate area to form a strip 630 of polysilicon from which select gates for the adjacent strings of memory cells will be formed. At the peripheral area, a strip 632 of polysilicon for the gate region of high voltage transistors is formed along with another strip 634 for the gate region of devices not positioned over the high voltage gate oxide. FIG. 12E further depicts the formation of a set of spacers 636 formed along the sidewalls of the different strips of control gate layer 624. A layer of polysilicon is deposited and etched back to form the spacers in one embodiment.

FIG. 12F depicts the substrate after forming another hard mask layer, e.g., SiN and pattern of photoresist. The array, select gate and peripheral gate regions are protected. The area between the select gate strip 630 and high voltage strip 632 is left open, as are the areas between the high voltage strip 632 and strip 634. The layer stack is etched using the hard mask as shown in FIG. 12G. The tunnel dielectric layer and portions of the high voltage gate oxide are etched. Etching continues into the substrate forming a first isolation trench 642 between the select gate strip and high voltage strip and a second isolation trench 644 between the high voltage strip and strip 634.

Although not shown, the pattern for etching the layer stack as shown in FIGS. 12F-12G may also include a pattern extending in the column direction for etching the layer stack into columns. Etching will form a plurality of charge storage regions in the row direction from each strip 620 of charge storage material. Each strips is divided along its length in the row direction to form multiple columns of storage regions. Polysilicon strip 630 will also be divided into individual select gates for the adjacent column of memory cells. Etching will continue into the substrate to provide isolation trenches between the adjacent columns of charge storage regions and active areas of the substrate. A pattern can also be applied to divide polysilicon strips 632 and 634 into individual gate regions. Although continued reference will be made to strips 620, 630, 632 and 634, it will be understood that in most implementations, the strips will include individual regions from the etching just described.

FIG. 12H depicts the substrate after filling the isolation trenches with an insulating material 646, e.g., oxide. Any excess oxide can be polished to form a planarized surface before depositing etch stop layer 648. As earlier described, a polysilicon etch stop layer can be used to assist in a subsequent polysilicon spacer formation process. With reference to FIG. 12I, peripheral gate connections are patterned using photoresist and etching to remove portions of the etch stop layer overlying the gate regions of strips 632 and 634. Etching creates openings 650 and 652 in the etch stop layer prior to forming a sacrificial layer 653. Depending on the function of the transistors, the openings can be single contact holes to connect a single gate or trenches to connect a few gates or a row of gates. For example, a single contact can be formed if the transistor is to receive an individual control signal. A group of gates can receive a common control signal by forming a trench over the multiple gate regions for openings 650 and 652.

An array connection is then patterned, first by applying strips 654 of photoresist. The sacrificial layer is then etched to form features 656 and 658 shown in FIG. 12J. These features extend in the row direction across the substrate and include first and second substantially vertical sidewalls. The first sidewall of feature 658 is aligned relative to the last control gate strip 629 for the columns and the second sidewall is aligned relative to the select gate strip 630 for the columns. The first sidewall of feature 656 is aligned relative to control gate 627 and the second sidewall is aligned relative to control gate 628. The sidewalls can be intentionally offset from a center of the upper surface of the corresponding gate to allow for the length (in the column direction) of spacers 660.

With reference to FIG. 12K, features 656 and 658 are removed after forming the spacers. The resulting spacers 660 are aligned with the upper surfaces of the corresponding strips of gate material due to the chosen spacing. The spaces between the spacers are then filled with a layer of oxide, followed by polishing to create a planarized surface. FIG. 12L depicts the substrate after using selective polysilicon etching to remove the spacers and etch trenches 662 in the etch stop layer 648. The oxide is used as a hard mask for the etch process and is then removed. FIG. 12M depicts the substrate after using selective oxide etching to extend connecting trenches 662 into the oxide layer until reaching the control gates. Etching also extends openings 650 and 652 into trenches that reach the respective gate regions. The etch stop layer serves as a hard mask for the connecting trench formation process.

FIG. 12N depicts the array after filling the connecting trenches with connection lines 668. At the array region, lines 668 can be continuous in the row direction, providing a control gate interconnect along a row of individual control gates resulting from the active area column formation earlier described. This control gate interconnect will extrinsically form a word line for the corresponding row of control gates. The select gate connection line 672 can also be continuous in the row direction to provide a common selection line for the columns in a block of memory cells. As earlier described, the peripheral circuitry may include a common connection line 674 and 676 or these may be individual lines per device as desired. The connection lines can be subjected to salicidation in one embodiment after being deposited.

FIG. 12O depicts the result of a final set of processing steps in which contacts to the connection lines are formed. A layer 678 of contact dielectric material, e.g., oxide, is deposited and patterned. Using the pattern as a mask, the oxide is etched to form contacts to the connection lines. The contact holes are filled with a suitable conductor such as polysilicon using a deposition process. Any excess polysilicon can be polished using CMP. After forming the contacts, further processing of metal layers to complete the device is performed.

Figure 13:
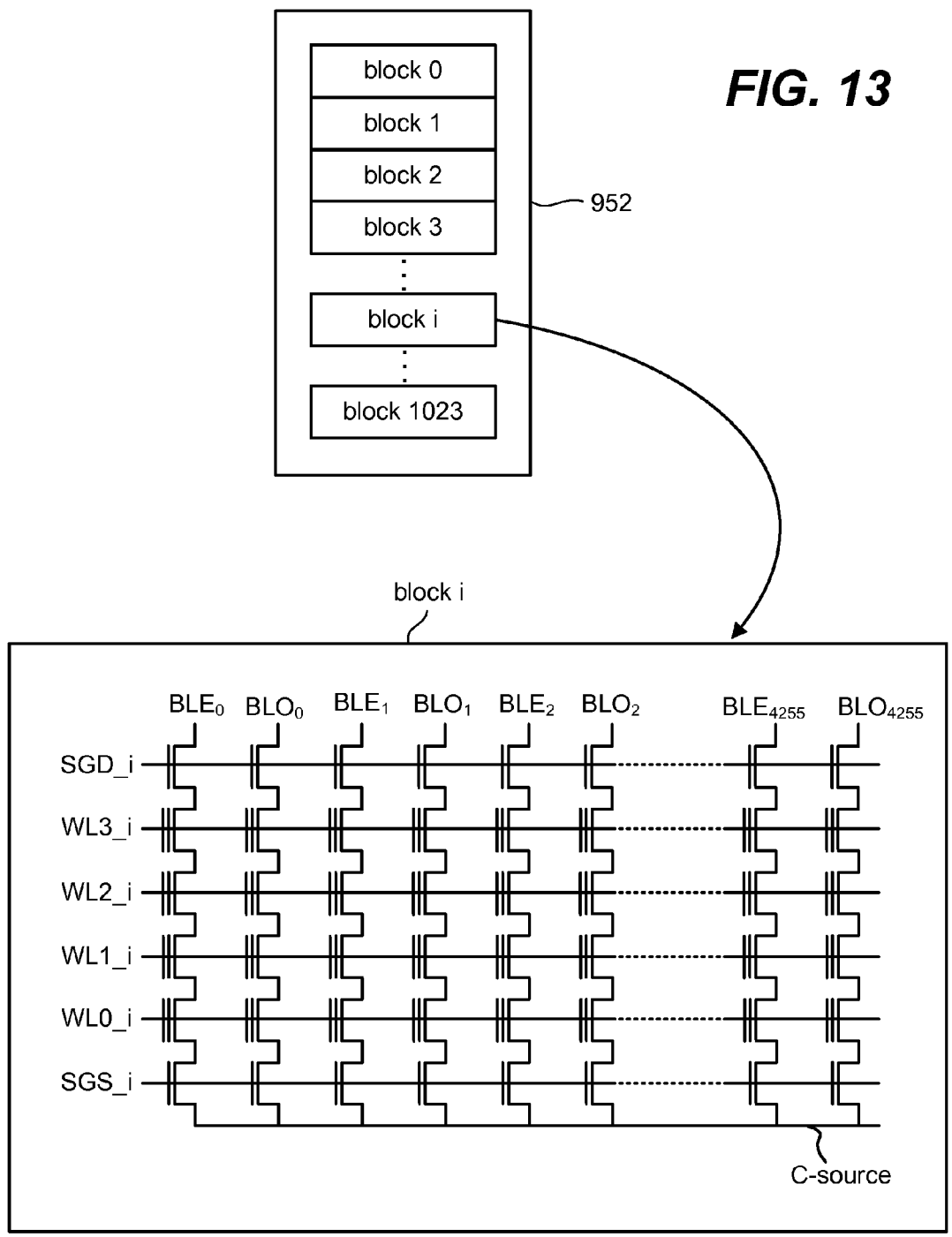
FIG. 13 depicts an exemplary organization of a memory array in accordance with one embodiment.

FIG. 13 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 15 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 14:
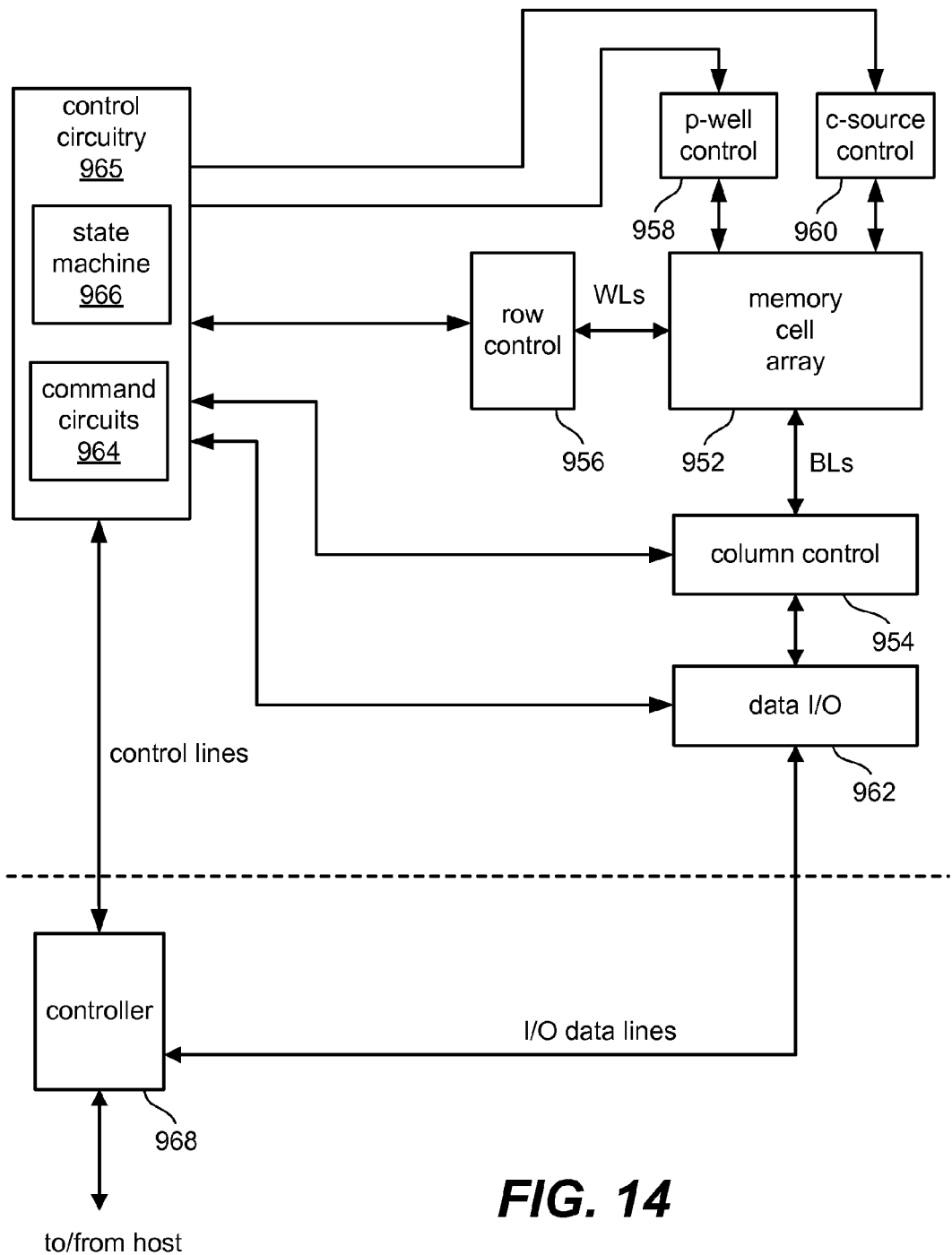
FIG. 14 is a block diagram of an exemplary memory system that can be used to implement embodiments of the disclosed technology.

FIG. 14 is a block diagram of one embodiment of a flash memory system that can be used to implement one or more embodiments of the present disclosure. Other systems and implementations can also be used. Memory cell array 952 is controlled by column control circuit 954, row control circuit 956, c-source control circuit 960 and p-well control circuit 958. Column control circuit 954 is connected to the bit lines of memory cell array 952 for reading data stored in the memory cells, for determining a state of the memory cells during a program operation, and for controlling potential levels of the bit lines to promote or inhibit programming and erasing. Row control circuit 956 is connected to the word lines to select one of the word lines, to apply read voltages, to apply program voltages combined with the bit line potential levels controlled by column control circuit 954, and to apply an erase voltage. C-source control circuit 960 controls a common source line connected to the memory cells. P-well control circuit 958 controls the p-well voltage.

The data stored in the memory cells are read out by the column control circuit 904 and are output to external I/O lines via data input/output buffer 962. Program data to be stored in the memory cells are input to the data input/output buffer 962 via the external I/O lines, and transferred to the column control circuit 954. The external I/O lines are connected to controller 968.

Command data for controlling the flash memory device is input to controller 968. The command data informs the flash memory of what operation is requested. The input command is transferred to state machine 966 which is part of control circuitry 965. State machine 966 controls column control circuit 954, row control circuit 956, c-source control 960, p-well control circuit 958 and data input/output buffer 962. State machine 966 can also output status data of the flash memory such as READY/BUSY or PASS/FAIL.

Controller 968 is connected to or connectable with a host system such as a personal computer, a digital camera, or personal digital assistant, etc. It communicates with the host that initiates commands, such as to store or read data to or from the memory array 952, and provides or receives such data. Controller 968 converts such commands into command signals that can be interpreted and executed by command circuits 964 which are part of control circuitry 965. Command circuits 964 are in communication with state machine 966. Controller 968 typically contains buffer memory for the user data being written to or read from the memory array.

One exemplary memory system comprises one integrated circuit that includes controller 968, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Various features and techniques are presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of fabricating non-volatile memory, comprising:
   forming a first layer of dielectric material over a surface of a substrate;
   forming a layer of charge storage material over the surface of the substrate;
   etching the layer of charge storage material to form a set of charge storage regions over the first layer of dielectric material at a first portion of the substrate, the charge storage regions including sidewalls elongated in a first direction with spaces between opposing sidewalls of storage regions adjacent in a second direction substantially perpendicular to the first direction;
   removing the layer of charge storage material from a second portion of the substrate;
   forming a second layer of dielectric material over the surface of the substrate;
   forming a layer of gate material over the surface of the substrate;
   etching the layer of gate material at the first portion of the substrate to form a set of control gates for the set of charge storage regions, the control gates at least partially occupying the spaces between adjacent charge storage regions; and
   etching the layer of gate material at the second portion of the substrate to form a gate region of a select transistor for the set of charge storage regions.

2. The method of claim 1, further comprising:
   etching the layer of gate material at a third portion of the substrate to form a gate region of a peripheral transistor associated with the set of charge storage regions; and
   etching the substrate to form an isolation trench between the gate region of the select transistor and the gate region of the peripheral transistor.

3. The method of claim 2, wherein:
   the peripheral transistor is a high voltage transistor forming a portion of control circuitry for the set of charge storage regions.

4. The method of claim 1, wherein etching the layer of charge storage material to form a set of charge storage regions includes:
   prior to forming the layer of gate material, etching the layer of charge storage material into strips elongated in the first direction with spaces therebetween in the second direction; and
   after forming the layer of gate material, etching the strips of charge storage material along their lengths in the first direction to form the set of charge storage regions and additional sets of charge storage regions, each set of charge storage regions including a plurality of charge storage regions adjacent to one another in the second direction, the sets being separated from one another in the first direction.

5. The method of claim 4, further comprising:
   etching the substrate between sets of charge storage regions to form isolation trenches; and
   filling the isolation trenches with an insulating dielectric.

6. The method of claim 1, wherein:
   the layer of charge storage material is a first layer of polysilicon;
   the set of charge storage regions is a set of conductive floating gate regions; and
   the layer of conductive material is a second layer of polysilicon.

7. The method of claim 1, wherein:
   the set of charge storage regions is a portion of a NAND string of flash memory cells;
   the select transistor is a drain select transistor for the NAND string connecting the NAND string to a bit line; and
   the non-volatile memory includes a source select transistor for the NAND string connecting the NAND string to a source line.

8. The method of claim 1, wherein:
   the set of charge storage regions is a portion of a NAND string of flash memory cells;
   the select transistor is a source select transistor for the NAND string connecting the NAND string to a source line; and
   the non-volatile memory includes a drain select transistor for the NAND string connecting the NAND string to a bit line.

9. A method of making non-volatile memory, comprising:
   forming a first dielectric region elongated in a first direction at a peripheral circuitry portion of a substrate;
   forming a first layer of dielectric material over a surface of the substrate at the peripheral circuitry portion and a memory portion of the substrate, the first layer overlying the first dielectric region at the peripheral circuitry portion of the substrate;

forming a set of charge storage regions over the first layer of dielectric material at the memory portion of the substrate, the charge storage regions having substantially vertical sidewalls elongated in the first direction and separated with spaces therebetween in a second direction substantially perpendicular to the first direction;

depositing a second layer of dielectric material at the peripheral circuitry portion and the memory portion of the substrate, the second layer of dielectric material being formed along the substantially vertical sidewalls of the charge storage regions;

removing the second layer of dielectric material at the peripheral circuitry portion of the substrate;

forming from a first layer of conductive material a set of control gates for the set of charge storage regions; and forming from the first layer of conductive material a gate region of a peripheral transistor, the peripheral transistor including a gate dielectric region formed of the first dielectric region and the first layer of dielectric material.

10. The method of claim 9, further comprising:
forming from the first layer of conductive material at the memory portion a gate region of a select transistor for the set of charge storage regions.

11. The method of claim 10, wherein:
forming the set of charge storage regions over the first layer of dielectric material includes:
depositing a layer of charge storage material at the memory portion of the substrate,
etching the layer of charge storage material to form the set of charge storage regions at a first part of the memory portion of the substrate, and
etching to remove the layer of charge storage material at a second part of the memory portion of the substrate; and
forming the gate region of the select transistor includes forming the gate region at the second part of the memory portion of the substrate where the layer of charge storage material is removed.

12. The method of claim 11, wherein forming the set of charge storage regions includes:
depositing the layer of charge storage material at the peripheral circuitry portion of the substrate; and
etching to remove the layer of charge storage material at the peripheral circuitry portion of the substrate.

13. The method of claim 9, wherein the peripheral transistor is a first peripheral transistor, the method further comprising:
forming from the first layer of conductive material a gate region of a second peripheral transistor at a third portion of the substrate, the second peripheral transistor including a gate dielectric region formed of the first layer of dielectric material and not the first dielectric region.

14. The method of claim 9, wherein:
the set of charge storage regions is a first set of charge storage regions;
forming the first set of charge storage regions includes:
forming strips of charge storage material elongated in the first direction across the substrate, and
dividing the strips of charge storage material along their lengths in the first direction thereby forming a plurality of sets of charge storage regions, the plurality of sets including the first set of charge storage regions.

15. The method of claim 14, wherein:
forming the strips of charge storage material is performed prior to forming the second layer of dielectric material; and dividing the strips of charge storage material is performed after forming the second layer of dielectric material.

16. A method of non-volatile memory fabrication, comprising:
forming at a peripheral circuitry region of a substrate a first gate dielectric region elongated in a first direction, the first gate dielectric region extending into the substrate;
forming at the peripheral circuitry region and a memory region of the substrate a first layer of dielectric material elongated in the first direction and a second direction over a surface of the substrate, the first layer of dielectric material overlying the first gate dielectric region at the peripheral circuitry region, the first and second directions being substantially perpendicular;
forming a set of strips of charge storage material elongated in the first direction over the surface of the substrate at the memory region with the first layer of dielectric material between the strips and the surface of the substrate, the first set of strips including substantially vertical sidewalls and being separated in the second direction with spaces therebetween;
forming a second layer of dielectric material along the sidewalls of the first set of strips and over exposed portions of the first layer of dielectric material at the memory region and peripheral circuitry region;
removing the second layer of dielectric material from at least a portion of the peripheral circuitry region including the first dielectric region;
forming a layer of conductive material at the memory region and peripheral circuitry region of the substrate; and
etching the layer of conductive material to form a set of strips of conductive material elongated in the first direction over the surface of the substrate, the set of strips of conductive material including a first strip forming a control gate for a first non-volatile storage element, a second strip forming a gate region for a select gate corresponding to the first non-volatile storage element, and a third strip forming a gate region for a peripheral circuitry transistor.

17. The method of claim 16, wherein:
the set of strips of charge storage material is a set of individual floating gate regions forming a portion of a NAND string of non-volatile memory cells; and
the set of strips of conductive material is a set of control gates for the portion of the NAND string of non-volatile memory cells, each non-volatile memory cell including one individual floating gate region and two control gates, the floating gate regions being controlled by adjacent control gates.

18. The method of claim 16, further comprising:
dividing the set of strips of charge storage material along their lengths in the first direction thereby forming a plurality of columns of individual floating gate regions.

19. The method of claim 18, wherein dividing the set of strips of charge storage material is performed after forming the set of strips of conductive material, the method further comprising:
dividing the set of strips of conductive material along their lengths in the first direction thereby forming from each strip a plurality of control gates separated from one another in the first direction; and
forming a third set of strips of conductive material elongated in the first direction and spaced apart in the second direction, the third set of strips being individually electrically connected to a plurality of control gates from one strip of the second set to thereby form a plurality of word lines.

20. The method of claim 19, wherein dividing the set of strips of charge storage material and the set of strips of conductive material includes etching the sets of strips in accordance with a pattern, the method further comprising:

continuing etching in accordance with the pattern by etching the second layer of dielectric material, the first layer of dielectric material and the substrate to form isolation trenches in the substrate; and forming an insulating material in the isolation trenches.

21. The method of claim 20, wherein the pattern includes:

a set of sacrificial features formed by patterning and etching a sacrificial layer using photoresist; and a set of spacers formed along sidewalls of the sacrificial features elongated in the second direction.

\* \* \* \* \*